US012666977B2

(12) United States Patent　　　　　(10) Patent No.: US 12,666,977 B2
Strong et al.　　　　　　　　　　　　(45) Date of Patent: Jun. 23, 2026

(54) METHODS, SYSTEMS, APPARATUS, AND ARTICLES OF MANUFACTURE FOR INTEGRATED CIRCUIT PACKAGE SUBSTRATES WITH HIGH ASPECT RATIO THROUGH GLASS VIAS

(71) Applicant: Intel Corporation, Santa Clara, CA (US)

(72) Inventors: Veronica Strong, Hillsboro, OR (US); Aleksandar Aleksov, Chandler, AZ (US); Georgios Dogiamis, Chandler, AZ (US); Telesphor Kamgaing, Chandler, AZ (US); Neelam Prabhu Gaunkar, Chandler, AZ (US); Brandon Rawlings, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 410 days.

(21) Appl. No.: 17/558,304

(22) Filed: Dec. 21, 2021

(65) Prior Publication Data

US 2023/0197620 A1　　Jun. 22, 2023

(51) Int. Cl.
　　*H10W 70/60*　　　(2026.01)
　　*H10W 70/05*　　　(2026.01)
　　*H10W 70/63*　　　(2026.01)
　　*H10W 70/66*　　　(2026.01)
　　*H10W 72/00*　　　(2026.01)
　　　　　(Continued)

(52) U.S. Cl.
　　CPC ........ *H10W 70/611* (2026.01); *H10W 70/095* (2026.01); *H10W 70/635* (2026.01); *H10W*

*90/00* (2026.01); *H10W 70/66* (2026.01); *H10W 72/823* (2026.01); *H10W 90/22* (2026.01)

(58) Field of Classification Search
　　CPC ............. H10W 70/611; H10W 70/095; H10W 70/635; H10W 70/66; H10W 70/685; H10W 70/692; H10W 70/68; H10W 70/65; H10W 90/00; H10W 90/22; H10W 72/823; H10W 20/056; H10W 20/057
　　See application file for complete search history.

(56) References Cited

U.S. PATENT DOCUMENTS 7,271,482 B2 * 9/2007 Kirby .................. H01L 25/0657
　　　　　　　　　　　　　　　　　257/781
7,804,175 B2 * 9/2010 Kamins ............. H01L 21/76898
　　　　　　　　　　　　　　　　　257/E21.597
　　　　　　　　(Continued)

OTHER PUBLICATIONS

Chen et al., "Modeling and Optimization of Magnetic Core TSV-Inductor for On-Chip DC-DC Converter," 2018 IEEE/ACM International Conference on Computer Aided Design (ICCAD), Nov. 5-8, 2018, San Diego, CA, USA, 8 pages. doi:10.1145/3240765. 3240829.

*Primary Examiner* — Dao H Nguyen
(74) *Attorney, Agent, or Firm* — Hanley, Flight & Zimmerman, LLC

(57) ABSTRACT

Methods, systems, apparatus, and articles of manufacture are disclosed for integrated circuit package substrates with high aspect ratio through glass vias. An example microelectronic package including a glass substrate including a via, the via including a high aspect ratio. The example microelectronic package further including a seed layer extending substantially evenly along an inner wall of the via.

22 Claims, 12 Drawing Sheets

(51) Int. Cl.
  *H10W 90/00* (2026.01)
  *H10W 90/22* (2026.01)

(56) References Cited

U.S. PATENT DOCUMENTS

| | | | | |
|---|---|---|---|---|
| 8,322,031 B2 * | 12/2012 | Chong | .................. | H05K 1/115 |
| | | | | 29/877 |
| 8,841,213 B2 * | 9/2014 | Shimoi | ................. | H01L 21/486 |
| | | | | 257/E21.586 |
| 2006/0246699 A1 * | 11/2006 | Weidman | ......... | H01L 21/76831 |
| | | | | 257/E21.174 |
| 2007/0096330 A1 * | 5/2007 | Shizuno | .............. | H10D 62/117 |
| | | | | 257/E29.022 |
| 2007/0170595 A1 * | 7/2007 | Sinha | ............... | H01L 21/76898 |
| | | | | 257/E21.597 |
| 2011/0076390 A1 * | 3/2011 | Cerio, Jr. | ......... | H01L 21/28556 |
| | | | | 427/96.8 |
| 2014/0144681 A1 * | 5/2014 | Pushparaj | ................ | B32B 7/12 |
| | | | | 428/164 |
| 2014/0254120 A1 * | 9/2014 | Yamamoto | .......... | H05K 3/0094 |
| | | | | 361/772 |
| 2019/0287815 A1 * | 9/2019 | Xu | .......................... | H01F 41/24 |
| 2022/0415779 A1 | 12/2022 | Dogiamis et al. | | |

* cited by examiner

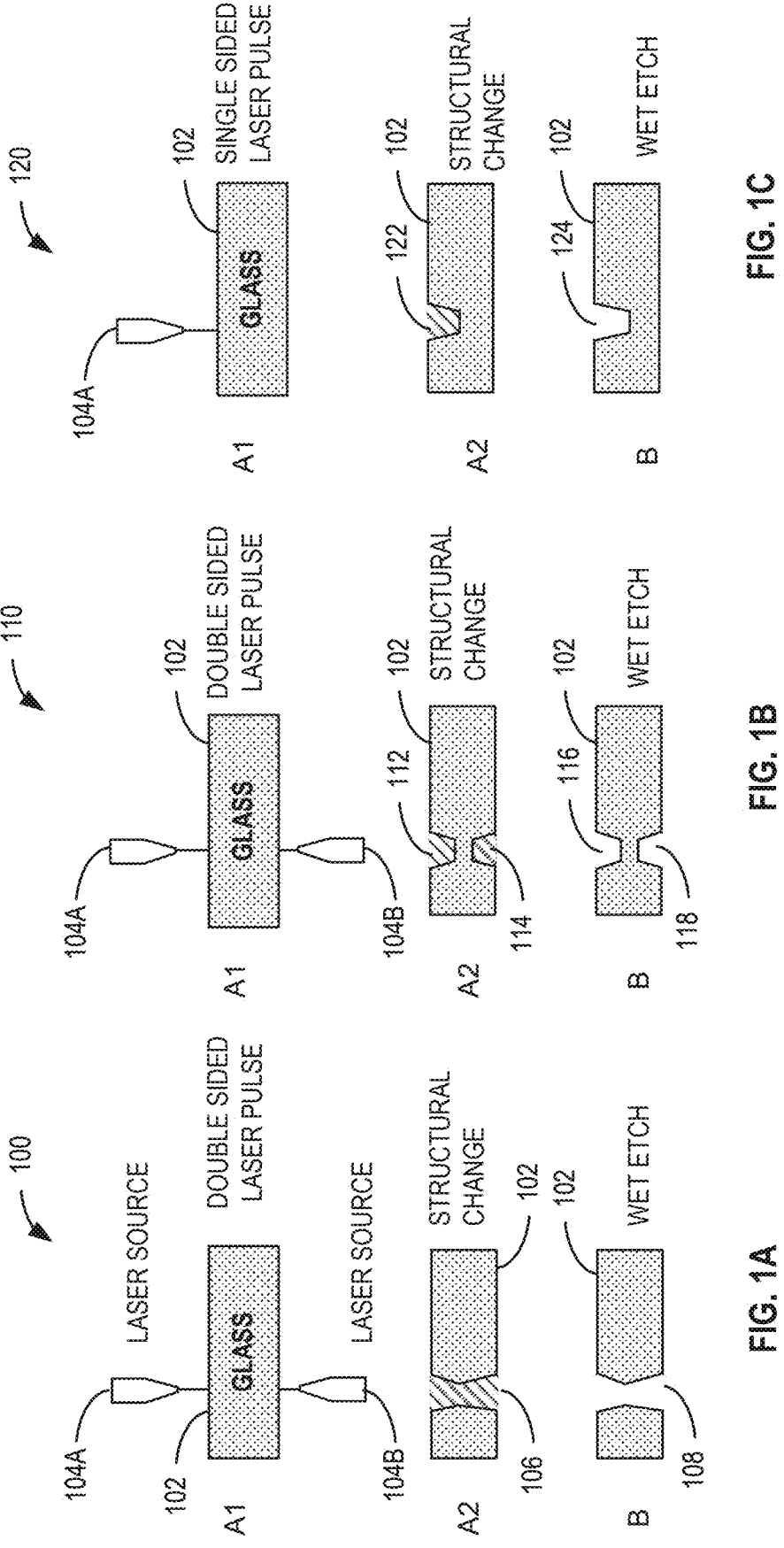

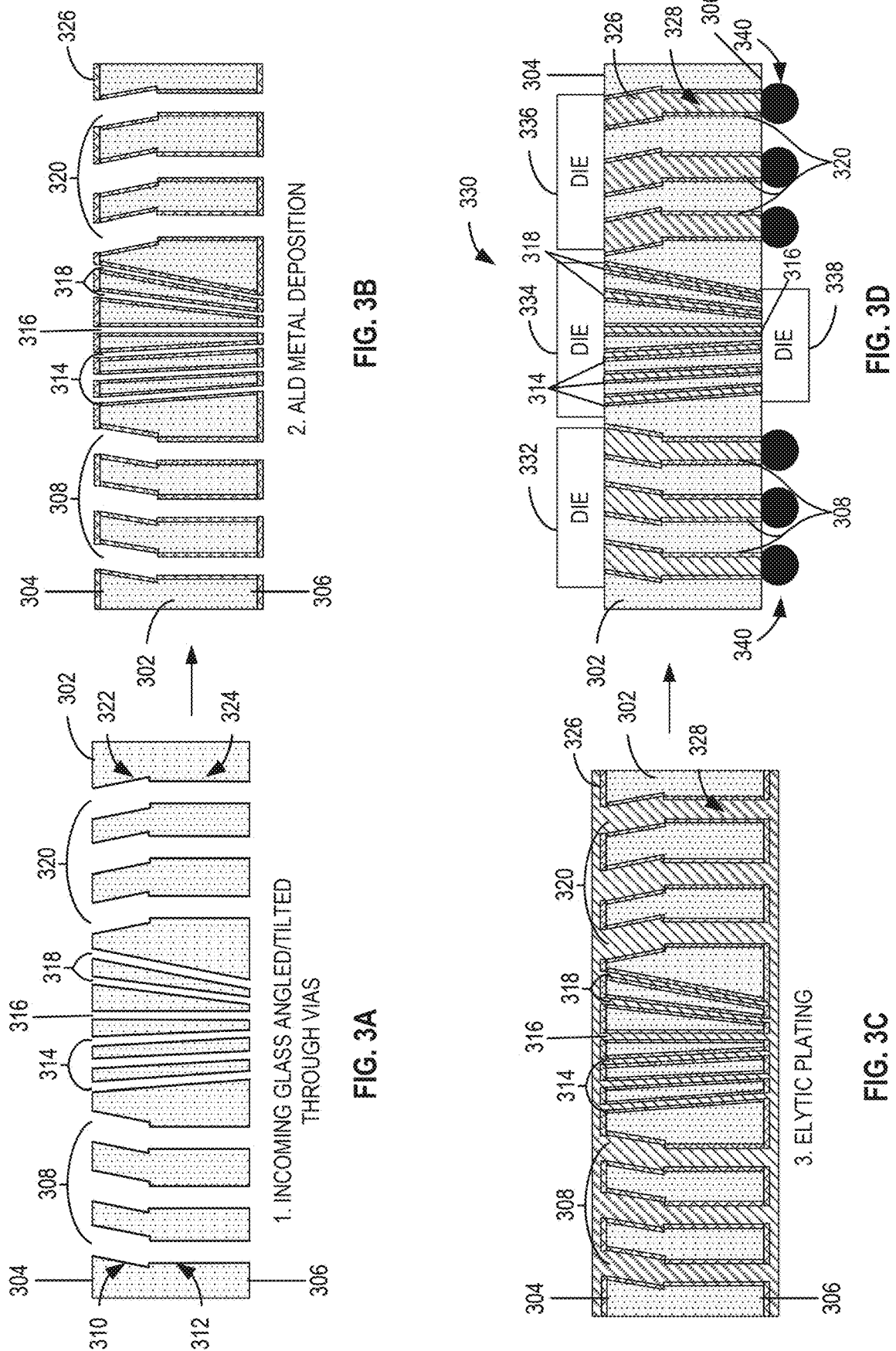

METHODS, SYSTEMS, APPARATUS, AND ARTICLES OF MANUFACTURE FOR INTEGRATED CIRCUIT PACKAGE SUBSTRATES WITH HIGH ASPECT RATIO THROUGH GLASS VIAS

FIELD OF THE DISCLOSURE

This disclosure relates generally to integrated circuits and, more particularly, to methods, systems, apparatus, and articles of manufacture for integrated circuit package substrates with high aspect ratio through glass vias.

BACKGROUND

In many integrated circuit packages, one or more semiconductor dies are mechanically and electrically coupled to an underlying package substrate, such as a glass substrate. By using laser-assisted etching, crack free, high-density vias (e.g., hollow shapes) can be formed into a glass substrate. Different process parameters can be adjusted to achieve vias of various shapes and depths for different devices, architectures, processes, and designs in glass. For example, building devices within vias (e.g., capacitors, resistors, batteries, or other such devices) can be achieved by adjusting the shapes, sizes, and depths of the vias.

BRIEF DESCRIPTION OF THE DRAWINGS

FIGS. 1A, 1B, 1C illustrate example vias in a glass substrate using laser-assisted etching constructed in accordance with teachings of this disclosure.

FIGS. 3A, 3B, 3C, 3D illustrate a process flow for constructing an example integrated circuit (IC) package in accordance with teachings of this disclosure.

Figure 2B:
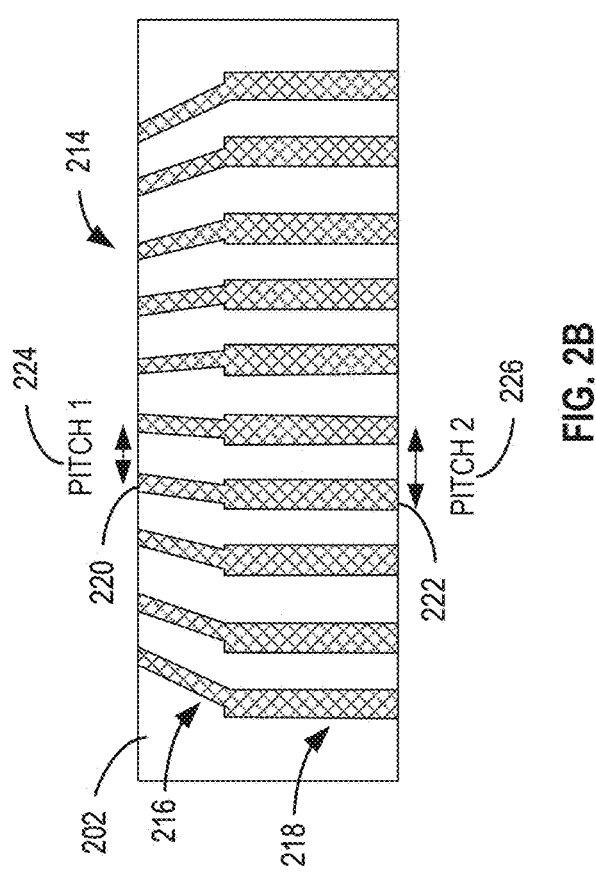
FIGS. 2A, 2B illustrate cross-sectional views of example angled via interconnects in a glass substrate constructed in accordance with teachings of this disclosure.

The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular. In general, the same reference numbers will be used throughout the drawing(s) and accompanying written description to refer to the same or like parts. As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another. Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name. As used herein, "approximately" and "about" refer to dimensions that may not be exact due to manufacturing tolerances and/or other real world imperfections.

DETAILED DESCRIPTION

In many integrated circuit (IC) packages, a die (e.g., a semiconductor die, a silicon die) is mechanically and/or electrically coupled to a substrate (e.g., a package substrate or a separate semiconductor die) via one or more metal interconnects. By using laser-assisted etching, crack free, high-density channels/vias (e.g., hollow shapes) can be formed into a glass substrate. Different process parameters can be adjusted to achieve vias of various shapes and depths for different devices, architectures, processes, and designs in glass. In some examples, the vias in the glass substrate can be filled with a conductive material (e.g., any suitable metal such as copper). In some examples, the vias in the glass substrate can be filled with materials other than metals (e.g., dielectrics, nitrides, oxides, etc.). For example, building devices within vias (e.g., capacitors, resistors, batteries, or other such devices) can be achieved by adjusting the shape, size, depth, and the materials filled in the vias.

Techniques for laser-assisted etching (e.g., drilling) generate channels/vias through a microelectronic/IC package substrate (e.g., a glass substrate). Typically, techniques for laser-assisted etching include applying laser pulses perpendicularly to a surface of the substrate (e.g., glass) to induce a morphological change and create a channel/via. In some examples, laser pulses can be applied to both sides of the glass substrate or only one side of the glass substrate. Techniques for laser-assisted etching can adjust laser pulse energy and exposure times for the glass substrate to adjust the morphological changes in the glass. For example, increasing the laser pulse energy and exposure time can create a through via in the glass substrate (e.g., a via that extends from one side of the glass substrate to the opposite side of the glass substrate), and decreasing the laser pulse energy and exposure time can achieve smaller depths for the via in the glass substrate (e.g., vias that do not extend all the way through the via but correspond to a blind shape (e.g., a recessed opening, a trench, etc.)). However, techniques for laser-assisted etching can cause sidewall roughness of the channels/vias in the glass substrate. Sidewall roughness in the channels/vias can negatively impact device performance for high signal integrity.

Typically, in microelectronic/IC packages, the channels/vias in the glass substrate are coated in a metal seed layer before being filled (e.g., with a metal, dielectric, etc.). In some examples, the metal seed layer adheres the conductive metal and/or dielectric filling in the channel/via to the glass substrate. Typical metal seed metallization methods such as, physical vapor deposition (PVD) or chemical vapor deposition (CVD), are accomplished by a direct line of sight deposition, meaning that the metallization method (e.g., PVD, CVD, etc.) cannot provide a uniform (e.g., conformal) film over the entire length of through channels/vias, especially if the channels/vias have high aspect ratios, are tilted, have different widths, have different angles from one another, are not straight or otherwise change direction within the glass core, etc. The aspect ratio that is achievable by the typical metallization methods is limited even when a channel/via extends straight through the glass substrate (e.g., not angled). For example, typical metallization methods (e.g., PVD, CVD, etc.) can conformally apply a film to a standard, vertical channel/via with a <6:1 aspect ratio. In some examples, typical metallization methods are able to achieve up to a 9:1 aspect ratio for a taper-angled straight, through channel/via. However, the typical metallization methods require flipping the glass substrate to coat the channel/via from both sides to achieve the 9:1 aspect ratio. Typical metallization methods are not able to achieve sufficient, conformal coating of the metal seed layer to be able to plate the filling across the entire channel/via to adhere the filling to the glass substrate. Furthermore, typical metallization methods are not able to achieve uniformity in the plating of the metal seed with a high aspect ratio for any non-traditional channels/vias (e.g., non-straight shaped vias, angled vias, through vias, narrow vias, etc.).

Examples disclosed herein use a conformal film deposition method to conformally metalize channels/vias that are angled/tilted, narrowed or tapered, non-straight shaped, etc. In some examples, channels/vias that are angled/tilted, non-straight narrowed, non-straight shaped, etc. allow for using the channels/vias in different applications. In some examples, channels/vias and/or planes can be used as building blocks for diagonal fanout applications. Variations in the channel/via and/or plane size, shape, orientation, etc. as disclosed herein also enable the creation of testing sockets, simple fanout packages, etc. Examples disclosed herein use a conformal metallization technology such as, atomic layer deposition (ALD), to allow for metallizing high aspect ratio channels/vias in a glass substrate with variations in the shape, size, angle, etc. Unlike other standard metal deposition methods (e.g., PVD, CVD, etc.), ALD can concurrently coat a variety of via dimensions and designs without direct line of sight in a single metallization process. Examples disclosed herein use ALD to perform metallization on variations of channels/vias while achieving a high aspect ratio. In examples disclosed herein, a high aspect ratio is defined herein to be greater than 9:1 and examples can achieve even higher aspect ratios (e.g., greater than 12:1, 15:1, 20:1 etc.). Examples disclosed herein provide a conformal metallization and coating of the channels/vias in the glass substrate by maintaining a same thickness on the channel/via surface through the glass substrate unlike typical metallization processes (e.g., PVD, CVD, etc.).

FIGS. 1A, 1B, 1C illustrate the construction of example vias in an example glass substrate 102 using laser-assisted etching in accordance with teachings of this disclosure. FIG. 1A illustrates an example process 100 for providing (drilling) a channel/via in a microelectronic package substrate (e.g., the example glass substrate 102) using two laser sources. In this example, the channel/via extends entirely through the glass substrate 102. The example process 100 includes a first laser source 104A and a second laser source 104B. In the illustrated example of FIG. 1A, the first laser source 104A and the second laser source 104B apply laser pulses substantially perpendicularly to the glass substrate 102 on opposite sides to induce an example structural change 106 in the glass substate 102. As used herein, substantially perpendicular means exactly perpendicular or within 5 degrees of exactly perpendicular. In some examples, the structural change 106 is produced by a through and/or blind drill in the glass substrate 102 via the first laser source 104A and the second laser source 104B. In some examples, following the application of the laser pulses to produce the structural change 106, the glass substrate 102 is subject to a wet etch process to remove the material of the glass substrate that underwent the structural change 106 to generate an example through via 108 in the glass substrate 102.

FIG. 1B illustrates an example process 110 for providing (drilling) two channels/vias in the example glass substrate 102 using two laser sources (e.g., the first laser source 104A and the second laser source 104B). In this example, although the two channels/vias are aligned in a direction substantially perpendicular to the glass substrate 102, the channels/vias are blind recesses that do not extend through the glass substrate 102. In the illustrated example of FIG. 1B, the first laser source 104A and the second laser source 104B apply laser pulses substantially perpendicularly to the glass substrate 102 on opposite sides to induce two structural changes (e.g., an example first structural change 112 and an example second structural change 114) in the glass substate 102. In some examples, the first structural change 112 and the second structural change 114 are produced by a blind drill in the glass substrate 102 via the first laser source 104A and the second laser source 104B with adjusted laser-assisted etching from the example process 100 of FIG. 1A. In the example process 110 of FIG. 1B, the laser pulse energy of the first laser source 104A and the second laser source 104B and the exposure time of the glass substrate 102 to the first laser source 104A and the second laser source 104B are adjusted to induce the first structural change 112 and the second structural change 114. For example, the laser pulse energy and exposure time of the first laser source 104A and the second laser source 104B in process 110 are decreased (relatively to the process 100 of FIG. 1A) to generate an example first cavity via 116 and an example second cavity via 118 once the material associated with the structural changes 112, 114 have been removed through a wet etch process. In some examples, the adjusted laser pulse energy and exposure time of the first laser source 104A and the second laser source 104B achieve smaller or greater depths of the first cavity via 116 and the second cavity via 118 in the glass substrate 102 than what is shown in the illustrated example.

FIG. 1C illustrates an example process 120 for providing (drilling) a channel/via in the example glass substrate 102 using one laser source (e.g., the first laser source 104A). In the illustrated example of FIG. 1C, the first laser source 104A applies laser pulses substantially perpendicularly to the glass substrate 102 to induce an example structural change 122 in the glass substate 102. In some examples, the structural change 122 is produced by a blind drill in the glass substrate 102 via the first laser source 104A. In some examples, the first laser source 104A induce the structural change 122 to generate an example cavity via 124 (following a wet etch process) in the glass substrate 102. In the example process 120 of FIG. 1C, the laser pulse energy of the first laser source 104A and the exposure time of the glass substrate 102 to the first laser source 104A are adjusted to induce the structural change 122. For example, the laser pulse energy and exposure time of the first laser source 104A in process 120 is decreased (compared to the laser-assisted etching illustrated in the example process 100 of FIG. 1A) to generate the cavity via 124. In some examples, the adjusted laser pulse energy and exposure time of the first laser source 104A achieves a smaller depth of the cavity via 124 in the glass substrate 102 than shown in FIG. 1C. In other examples, the laser pulse energy and exposure time of the first laser source 104A in process 120 can be adjusted (e.g., increased) to increase the depth of the cavity via 124 and/or create a through via in the glass substrate 102 (e.g., the cavity via 124 would extend from one side of the glass substrate 102 to the opposite side of the glass substrate 102).

Figure 2A:
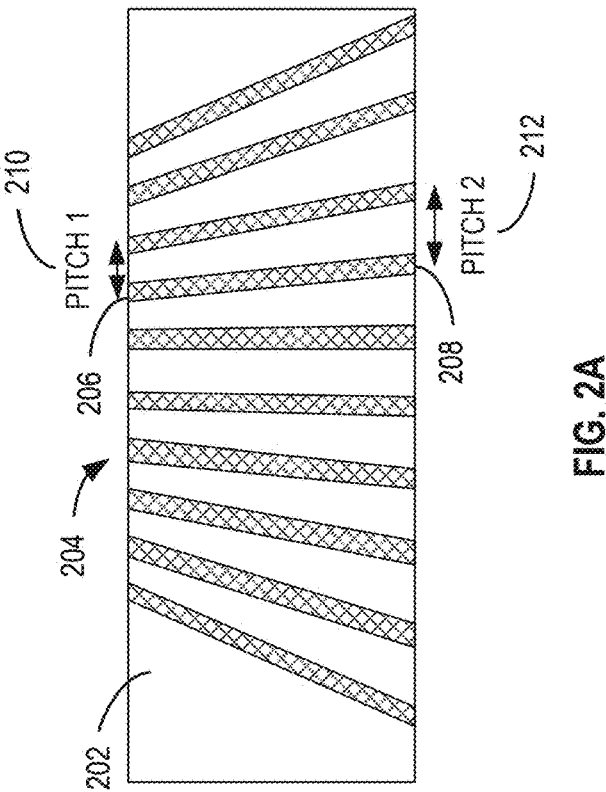

FIGS. 2A, 2B illustrate cross-sectional views of example angled via interconnects in a glass substrate. FIG. 2A illustrates an example glass substrate 202 including example vias 204. In some examples, the vias 204 are angled, through vias (e.g., the vias 204 extend from one side of the glass substrate 202 to the opposite side of the glass substrate 202). In FIG. 2A, the vias 204 are arranged in an array in the glass substrate 202. The example vias 204 are angled in the glass substrate 202 in a fanout scheme that provides a pitch translation between the opposite sides of the glass substrate without an additional redistribution layer (RDL). For example, the plurality of vias 204 include example first ends 206 and example second ends 208. In some examples, the first ends 206 have an example first pitch 210 and the second ends 208 have an example second pitch 212. In the illustrated example of FIG. 2A, the first pitch 210 is less than the second pitch 212. However, the first ends 206 and the second ends 208 can have any pitches. In this example, each via 204 extends at a slightly different angle than every other via in the array of vias 204. As such, using traditional line of sight deposition process (e.g., PVD, CVD, etc.) would not be able to deposit metal onto the surfaces of via 204 in a single deposition process or a double-sided deposition process (e.g., depositing the metal on a first side/surface and flipping the substrate to deposit the metal on a second side/surface). By contrast, a metal seed layer can be deposited on all of the vias 204 in a single ALD process.

FIG. 2B illustrates the glass substrate 202 including example vias 214. In some examples, the vias 214 are angled, through vias (e.g., the vias 214 extend from one side of the glass substrate 202 to the opposite side of the glass substrate 202). In FIG. 2B, the vias 214 are arranged in an array in the glass substrate 202 with each of the vias 214 including a first portion or segment 216 and a second portion or segment 218. In this example, the first portions 216 of the example vias 214 are angled in the glass substrate 202 in a fanout scheme with each first portion 216 of the vias 214 extending at a slightly different angle than the other first portions of the other vias 214. Further, in this example, the second portions 218 of the example vias 214 are in a parallel scheme in which the second portions 218 of the vias 214 are substantially parallel to one another. As shown in the illustrated example, the first portions 216 of the example vias 214 connected to the second portions 218 of the example vias 214, thereby resulting in ones of the vias 214 including a bend or change in direction along their length that prevent a direct line of sight through the full length of the vias 214. As a result, traditional line of sight deposition process (e.g., PVD, CVD, etc.) would not be able to deposit metal in such vias. As with FIG. 2A, the example vias 214 of FIG. 2B provide a pitch translation between the first ends 220 and the second ends 222. In some examples, the first ends 220 have an example first pitch 224 and the second ends 222 have an example second pitch 226. In the illustrated example of FIG. 2, the first pitch 224 is greater than the second pitch 226. However, the first ends 220 and the second ends 222 can have any pitches.

FIGS. 3A, 3B, 3C, 3D illustrate a process flow of constructing vias in an example glass substrate 302 for an example IC package. FIG. 3A illustrates the example glass substrate 302 including a plurality of multi-pitch and multi-angled through vias/channels (e.g., generated using laser-assisted etching technique(s) illustrated in FIGS. 1A-1C). In the illustrated example of FIG. 3A, the glass substrate 302 includes a plurality of vias/channels that extend through the glass substrate 302 at successively different angles, pitches, etc. In some examples, the glass substrate 302 includes an example top surface 304 and an example bottom surface 306. The example glass substrate 302 includes a plurality of multi-pitch and multi-angled through vias/channels that extend between the top surface 304 and the bottom surface 306. In some examples, the glass substrate 302 includes example first vias 308 that have example first portions 310 and example second portions 312. The example first portions 310 of the first vias 308 connect with the second portions 312, and the first portions 310 and the second portions 312 of the first vias 308 extend through the glass substrate 302 at different angles to result in a change in direction in the first vias 308. In some examples, the change in the direction is such that there is no straight line of sight through the vias 308 between the top and bottom surfaces 304, 306 of the glass substrate 302. In some examples, the first portions 310 extend through a first portion of the glass substrate 302 at a first angle and the second portions 312 extend through a second portion of the glass substrate 302 at a second angle. In some examples, the first portions 310 and the second portions 312 can have different pitches, dimensions (e.g., widths, length, etc.), non-line of sight features, etc.

The example glass substrate 302 of FIG. 3A further includes example second vias 314, an example third via 316, and example fourth vias 318. In some examples, the second vias 314 extend through the glass substrate 302 between the top surface 304 and the bottom surface 306 at a first angle, and the example fourth vias 318 extend through the glass substrate 302 between the top surface 304 and the bottom surface 306 at a second angle. In some examples, the first angle of the second vias 314 and the second angle of the fourth vias 318 are different angles. The example third via 316 extends through the glass substrate 302 between the top surface 304 and the bottom surface 306 vertically (e.g., the third via 316 is not angled relative to a direction substantially perpendicular to the top surface 304 of the glass substrate 302). The example second vias 314, the example third via 316, and the example fourth vias 318 are illustrated as extending through the glass substrate 302 at different angles that are not perpendicular to the top surface 304 of the glass substrate 302. However, the example second vias 314, the example third via 316, and the example fourth vias 318 can have different pitches, dimensions (e.g., widths, length, etc.), non-line of sight features, etc.

In the illustrated example of FIG. 3A, the example glass substrate 302 further includes example fifth vias 320. The example fifth vias 320 have example first portions 322 and example second portions 324. In some examples, the first portions 322 of the fifth vias 320 connect with the second portions 324 of the fifth vias 320, and the first portions 322 and the second portions 324 extend through the glass substrate 302 at different angles to result in a change in direction in the fifth vias 320. The example first portions 322 extend through a first portion of the glass substrate 302 at a first angle, and the second portions extend through a second portion of the glass substrate 302 at a second angle different than the first angle. However, in this example, the first portions 322 of different ones of the vias 320 are substantially parallel to one another and the second portions 324 are also substantially parallel to one another. As used herein, substantially parallel means exactly parallel or within 5 degrees of exactly parallel. In some examples, the first portions 322 and the second portions 324 of the fifth vias 320 can have different pitches, dimensions (e.g., widths, length, etc.), non-line of sight features, etc. In the illustrated example of FIG. 3A, the first vias 308, the second vias 314, the third via 316, the fourth vias 318, and the fifth vias 320 all include high aspect ratios. In examples disclosed herein, a high aspect ratio is greater than a nine to one ratio (e.g., a ten to one ratio, a fifteen to one ratio, a twenty to one ratio, etc.). In some examples, a high aspect ratio can be greater than a six to one ratio. In some examples, the first vias 308, the second vias 314, the third via 316, the fourth vias 318, and the fifth vias 320 can include any aspect ratio such as, for example, lower aspect ratios (e.g., an eight to one ratio, a five to one ratio, etc.).

FIG. 3B illustrates the example glass substrate 302 including the plurality of multi-pitch and multi-angled through vias/channels (e.g., the example first vias 308, the example second vias 314, the example third via 316, the example fourth vias 318, and the example fifth vias 320) illustrated in FIG. 3A after metal deposition using ALD. As shown in the illustrated example, the vias/channels (e.g., the example first vias 308, the example second vias 314, the example third via 316, the example fourth vias 318, and the example fifth vias 320) are coated with an example metal seed layer 326. In some examples, an ALD process may additionally or alternatively be used to deposit an adhesion layer that conformally coats the vias/channels. In some examples, the adhesion layer is applied before the metal seed layer 326 shown in FIG. 3B. In some examples, an adhesion layer is a thin layer (e.g., 1 to 20 nanometers (nm)) of a material that adheres to both a glass surface (e.g., the glass substrate 302) and conductive metal surfaces (e.g., titanium nitride (TiNx), titanium oxide (TiOx), silicon nitride (SiNx), carbide, tungsten (W), or any other adhesive material). In some examples, the metal seed layer 326 includes copper (Cu), ruthenium (Ru), cobalt (Co), tungsten (W), or any other conductive films. In some examples, the metal seed layer can be 1 to 50 nm thick. The example metal seed layer 326 and/or the adhesion layer is deposited substantially evenly on all exposed surfaces of the glass substrate 302 including the top and bottom surfaces 304, 306 of the substrate 302 as well as along inner walls of the vias/channels (e.g., the example first vias 308, the example second vias 314, the example third via 316, the example fourth vias 318, and the example fifth vias 320). As used herein, a layer that is deposited substantially evenly refers to a layer (e.g., the adhesion layer, the example metal seed layer 326, etc.) that has a thickness that is within 5% of a perfectly uniform thickness across all surfaces on which the layer is deposited. For example, the second vias 314 and the fourth vias 318 extend through the glass substrate 302 at different angles. In such an example, the metal seed layer 326 is deposited substantially evenly along the inner walls of the second vias 314 and the inner walls of the fourth vias 318 where the thickness of the metal seed layer 326 is the same (within 5%) in the second vias 314 and the fourth vias 318. In some examples, the metal seed layer 326 consistently conforms to different angles, pitches, dimensions, etc. of the different surfaces/walls of the vias/channels (e.g., the example first vias 308, the example second vias 314, the example third via 316, the example fourth vias 318, and the example fifth vias 320) in the glass substrate 302.

In the illustrated example of FIG. 3B, the example metal seed layer 326 (and an adhesion layer) is deposited in the vias/channels (e.g., the example first vias 308, the example second vias 314, the example third via 316, the example fourth vias 318, and the example fifth vias 320) using ALD. In discussed above, ALD is a non-line of sight deposition method that allows for the metal seed layer 326 (and an adhesion layer) to be deposited substantially evenly/conformally on the surfaces of the vias/channels and the glass substrate 302 for any design features (e.g., vias/channels with different angles, pitches, dimensions, surface roughness, etc.). ALD offers atomic level control of deposition, which allows ALD to be highly conformal and allow for full coverage of the metal seed layer 326 (and an adhesion layer) to be deposited in the vias/channels with high aspect ratios that have any design features. In examples disclosed herein, the metal seed layer 326 (and/or the adhesion layer) are deposited using ALD to achieve conformal film coatings across the surfaces of any type or combinations of different types of vias/channels (e.g., the example first vias 308, the example second vias 314, the example third via 316, the example fourth vias 318, and the example fifth vias 320) and/or other features in the glass substrate 302. In some examples, the ALD deposition method can be used to deposit films/layers other than metal seeds (e.g., the metal seed layer 326) and adhesion layers. For example, ALD can conformally deposit different dielectrics, nitrides, and/or oxides (e.g., titanium nitride (TiNx), silicon nitride (SiNx), aluminum oxide ($Al_2O_3$), hafnium oxide (HfOx), Tantalum (Ta), titanium oxide (TiOx), etc.) on surfaces of the vias/channels (e.g., the example first vias 308, the example second vias 314, the example third via 316, the example fourth vias 318, and the example fifth vias 320) with high aspect ratios and/or other non-standard shapes and/or dimensions in a glass substrate (e.g., the glass substrate 302). An example of depositing a dielectric in the vias/channels using ALD is described in further detail below in connection with FIG. 4.

FIG. 3C illustrates the example glass substrate 302 including the plurality of multi-pitch and multi-angled through vias/channels (e.g., the example first vias 308, the example second vias 314, the example third via 316, the example fourth vias 318, and the example fifth vias 320) including the metal seed layer 326 after electroplating. In the illustrated example of FIG. 3C, the metal seed layer 326 is not specifically demarcated from the rest of the material added during the electroplating process. In some examples, the first vias 308, the second vias 314, the third via 316, fourth vias 318, and the fifth vias 320 are electroplated with an example filling 328 after the conformal coating of the metal seed layer 326 using ALD illustrated in FIG. 3B. In the illustrated example, the filling 328 is a metal such as, for example, copper. However, the filling 328 can be any other conductive metals, dielectrics, nitrides, and/or oxides.

FIG. 3D illustrates an example IC package 330 that includes the example glass substrate 302 including the plurality of multi-pitch and multi-angled through vias/channels (e.g., the example first vias 308, the example second vias 314, the example third via 316, the example fourth vias 318, and the example fifth vias 320) and the metal seed layer 326 after electroplating (as shown in FIG. 3C) and subsequent removal of excess metal on the top and bottom surfaces 304, 306 of the glass substrate 302. In some examples, the example IC package 330 includes an example first die 332, an example second die 334, an example third die 336, and an example fourth die 338. In some examples, the first die 332, the second die 334, the third die 336, and the fourth die 338 are semiconductor (e.g., silicon) dies that are mounted to the glass substrate 302. The example first die 332, the example second die 334, and the example third die 336 are mounted directly to a side of the glass substrate 302 (e.g., the top surface 304). The example fourth die 338 is mounted directly to a different side of the glass substrate 302 (e.g., the bottom surface 306) from the first die 332, the second die 334, and the third die 336. In some examples, each of the first die 332, the second die 334, the third die 336, and the fourth die 338 are electrically and mechanically coupled directly to the vias/channels in the glass substrate 302. While the example IC package 330 of FIG. 3D includes four dies (e.g., the first die 332, the second die 334, the third die 336, and the fourth die 338), in other examples, any number of dies may be mounted to the glass substrate 302. In some examples, the dies (e.g., the first die 332, the second die 334, the third die 336, and the fourth die 338) are mounted to routing layer(s) (e.g., redistribution layer(s)) positioned between the dies and the glass substrate 302.

In the illustrated example, the IC package 330 further includes an example array of bumps or balls 340 (e.g., a ball grid array, micro ball array, etc.). In some examples, the first die 332, the second die 334, the third die 336, the fourth die 338, and the balls 340 are connected to the plurality of multi-pitch and multi-angled through vias/channels (e.g., the example first vias 308, the example second vias 314, the example third via 316, the example fourth vias 318, and the example fifth vias 320). The example first die 332 is connected to the example balls 340 via the example first vias 308. The example second die 334 is connected to the example fourth die 338 via the example second vias 314, the example third via 316, and the example fourth vias 318. The example third die 336 is connected to the example balls 340 via the example fifth vias 320. The filling 328 in the vias/channels (e.g., the example first vias 308, the example second vias 314, the example third via 316, the example fourth vias 318, and the example fifth vias 320) electrically connects the first die 332, the second die 334, the third die 336, the fourth die 338, and the balls 340 through the glass substrate 302.

Figure 4:
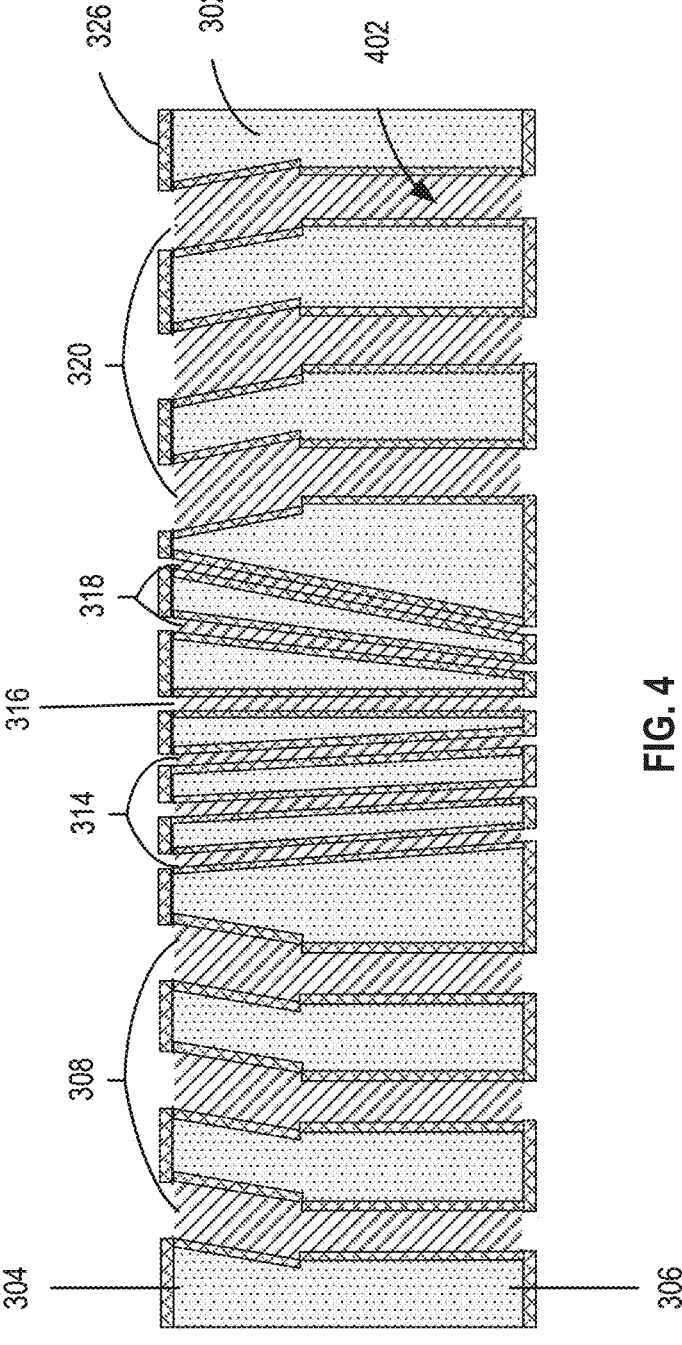
FIG. 4 illustrates example angled vias in a glass substrate filled with a dielectric constructed in accordance with teachings of this disclosure.

FIG. 4 illustrates angled vias in the example glass substrate 302 of FIGS. 3A-3D filled with a dielectric. In the illustrated example of FIG. 4, the glass substrate 302 includes the plurality of multi-pitch and multi-angled through vias/channels (e.g., the example first vias 308, the example second vias 314, the example third via 316, the example fourth vias 318, and the example fifth vias 320) as illustrated in FIGS. 3A-3D. In some examples, a metal seed layer (e.g., the example metal seed layer 326) and an adhesion layer are deposited in the first vias 308, the second vias 314, the third via 316, the fourth vias 318, and the fifth vias 320 using ALD, as illustrated in FIG. 3B. In some examples, the first vias 308, the second vias 314, the third via 316, the fourth vias 318, and the fifth vias 320 are filled with an example filling 402 after the conformal coating of the metal seed layer. In some examples, the filling 402 is a dielectric material/plug or a magnetic material/plug. In such examples, the dielectric plug or magnetic plug (e.g., the filling 402) can be implemented for any device specific applications such as, for example, inductors.

Figures 5A, 5B:
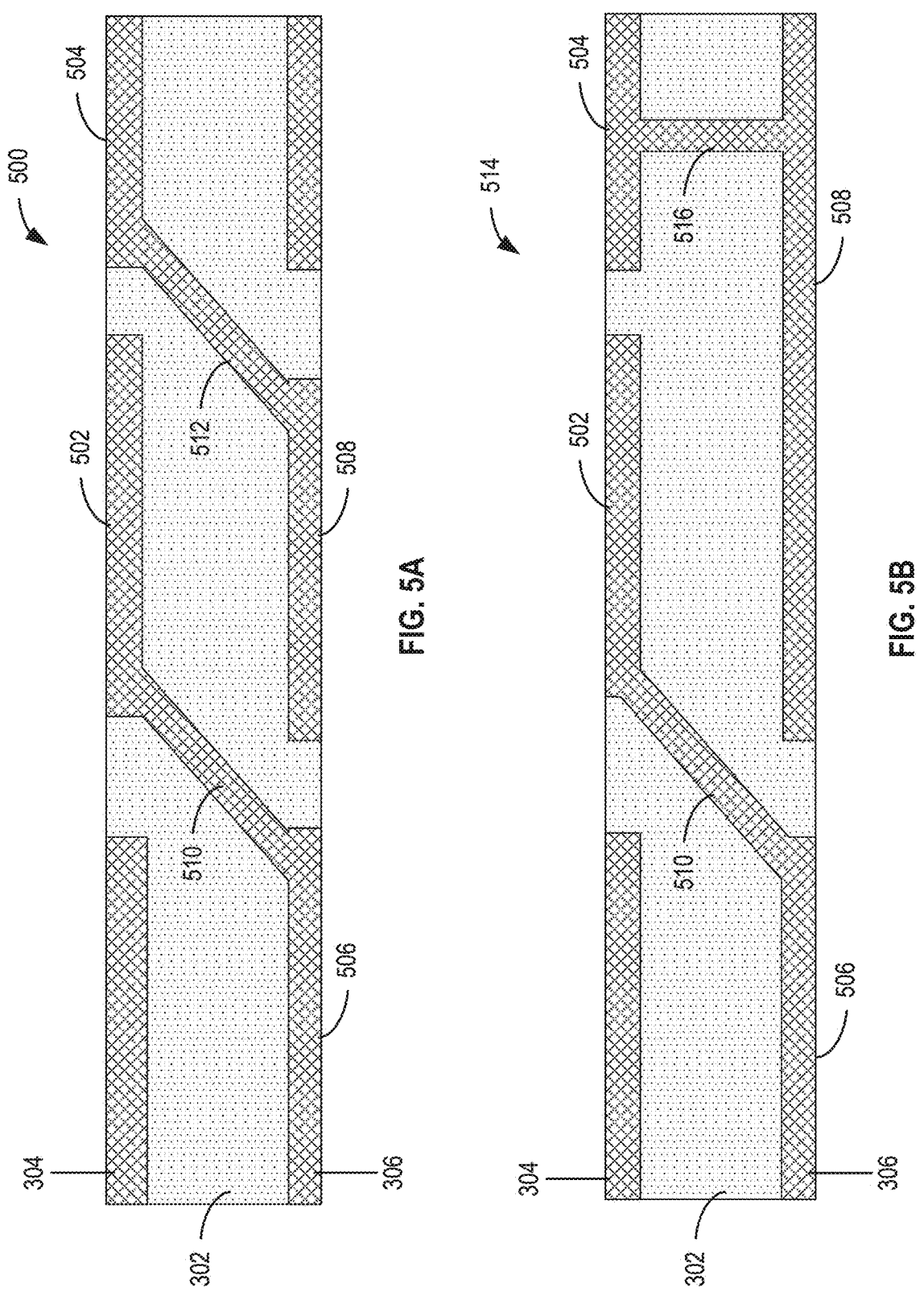
FIGS. 5A, 5B illustrate example angled vias connected to example top bottom metal planes in different example glass substrates constructed in accordance with teachings of this disclosure.

FIGS. 5A, 5B illustrate example angled vias in the example glass substrate 302 of FIGS. 3A-3D connected to example top conductive planes and example bottom conductive planes. FIG. 5A illustrates an example package substrate 500 including an example first top conductive plane 502, an example second top conductive plane 504, an example first bottom conductive plane 506, and an example second bottom conductive plane 508. In some examples, the first top conductive plane 502, the second top conductive plane 504, the first bottom conductive plane 506, and the second bottom conductive plane 508 are composed of metal (e.g., copper, aluminum, or other conductive metals). In some examples, the first top conductive plane 502 and the second top conductive plane 504 are on a first side of the glass substrate 302 (e.g., the top surface 304), and the example first bottom conductive plane 506 and the second bottom conductive plane 508 are on a second side of the glass substrate 302 (e.g., the bottom surface 306). In some examples, the first side of the glass substrate 302 is opposite the second side of the glass substrate 302. The example first top conductive plane 502 and the example first bottom conductive plane 506 are conductively connected to an example first angled via 510, and the example second top plane 504 and the example second bottom conductive plane 508 are conductively connected to an example second angled via 512.

In the illustrated example, an adhesion layer and a metal seed layer are deposited in the first and second angled vias 510, 512 as well as openings or recesses corresponding to the conductive planes 502, 504, 506, 508 using ALD. Further, in this example, the first and second angled vias 510, 512 and the conductive planes 502, 504, 506, 508 are electroplated with a metal filling such as, for example, copper (similar to the example first vias 308, the example second vias 314, the example third via 316, the example fourth vias 318, and the example fifth vias 320 of FIGS. 3A-3D). In some examples, the first top conductive plane 502 and the second top conductive plane 504 are offset relative to the first bottom conductive plane 506 and the second bottom conductive plane 508 respectively so as to be non-overlapping in a direction perpendicular to the first top conductive plane 502 and the second top conductive plane 504. More particularly, in this example, the first top conductive plane 502 is aligned with or overlapping the second bottom conductive plane 508. However, in some examples, the top conductive plane 502 is not aligned directly with the second bottom conductive plane 508. The example first angled via 510 is angled (e.g., relative to the direction perpendicular to the conductive planes 502, 504, 506, 508) to extend from the first top plane 502 to the first bottom plane 506, and the example second angled via 512 is angled (e.g., relative to the direction perpendicular to the conductive planes 502, 504, 506, 508) to extend from the second top plane 504 to the second bottom plane 508. In this example, the angles of both the first angled via 510 and the second angled via relative to the direction perpendicular to the planes 502, 504, 506, 508 are substantially the same. That is, the first and second angled vias 510, 512 are substantially parallel but are neither parallel nor perpendicular to the conductive planes 502, 504, 506, 508.

FIG. 5B illustrates an example package substrate 514 including the first top conductive plane 502, the second top conductive plane 504, the first bottom conductive plane 506, and the second bottom conductive plane 508 combined with an example vertical via 516. In this example the vertical via 516 extends "vertically" in that it extends in a direction substantially perpendicular to the conductive planes 502, 504, 506, 508 and the top and bottom surfaces of the glass substrate 302. In some examples, the second top conductive plane 504 and the second bottom conductive plane 508 are conductively connected to the vertical via 516. In this example, the second top conductive plane 504 is aligned with the second bottom conductive plane 508 so as to be overlapping in a direction perpendicular to the second top conductive plane 504. As a result, the example vertical via 516 is able to extend from the second top plane 504 to the second bottom plane 508. Unlike the example package substrate 500 of FIG. 5A in which both of the vias 510 are substantially parallel to one another, the vias 510, 516 in the example package substrate 514 of FIG. 5B are angled relative to one another. Despite the different angles for the different vias 510, 516 in FIG. 5B, an adhesion layer and/or a metal seed layer can still conformally applied to all exposed surfaces using ALD.

Figures 6A, 6B:
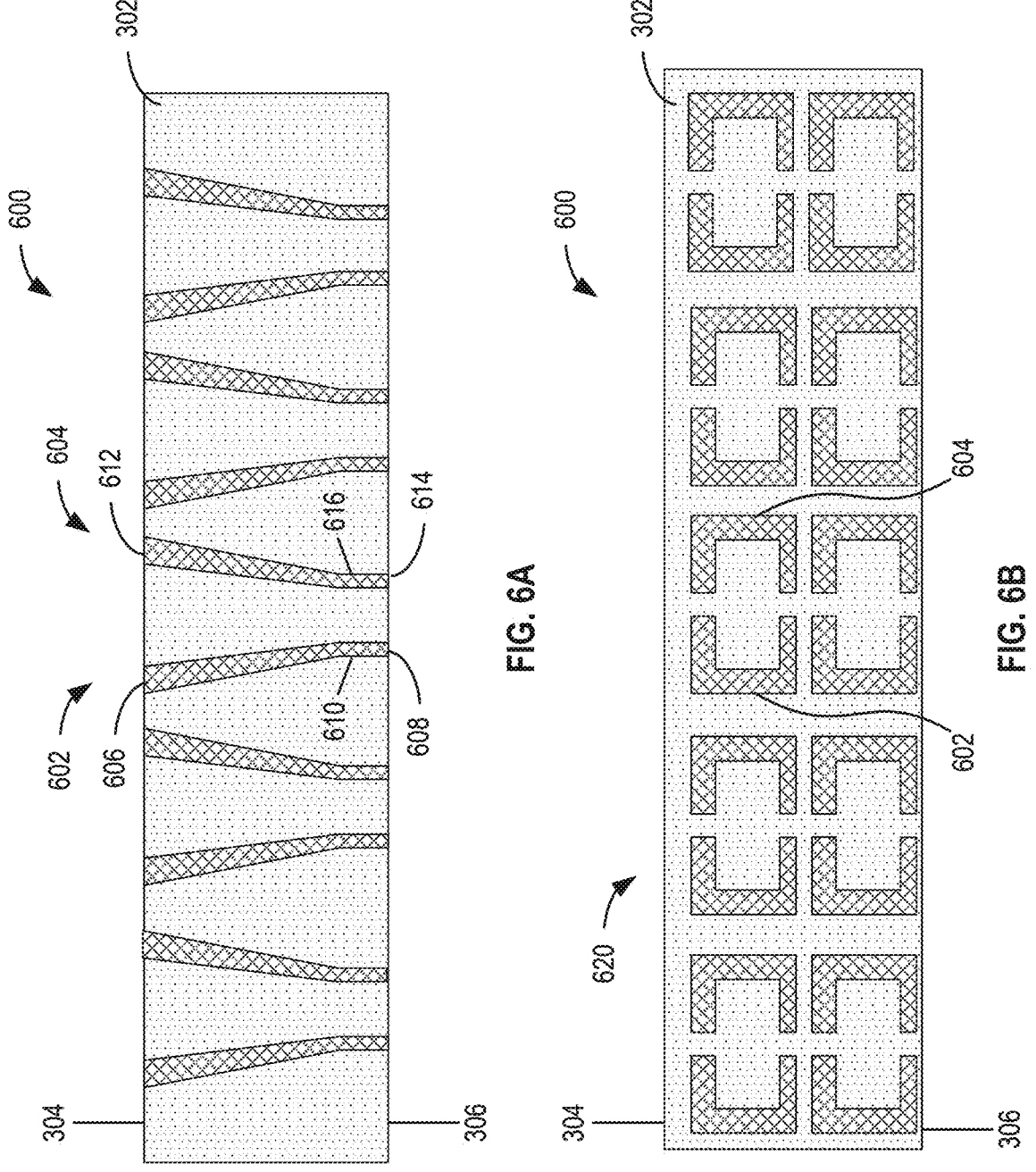
FIGS. 6A, 6B illustrate a cross-sectional via and a top view, respectively, of an example array of antennas constructed from angled vias in a glass substrate constructed in accordance with teachings of this disclosure.

FIGS. 6A, 6B illustrate angled vias in the example glass substrate 302 of FIGS. 3A-3D to construct an example array of antennas 600. FIG. 6A illustrates a cross-sectional view of the array of antennas 600 in the glass substrate 302. In the illustrated example, the array of antennas 600 includes an example first angled via 602 and an example second angled via 604. The example first angled via 602 is angled in a first direction, and the example second angled via 604 is angled in a second direction. In this example, both the first direction and the second direction are different than a direction extending perpendicular to the top and bottom surfaces of the glass substrate 302. In some examples, the first angled via 602 includes an example first portion 606 and an example second portion 608. The first portion 606 is angled in the first direction and tapers toward an example point 610 in the first angled via 602. In some examples, the second portion 608 is not angled (e.g., extends vertically or substantially perpendicular to the outer surfaces of the glass substrate 302). In some examples, the first portion 606 and the second portion 608 are connected at the point 610. In some examples, the first portion 606 and the second portion 608 differ in dimensions (e.g., width, length, etc.). In some examples, the second angled via 604 includes an example first portion 612 and an example second portion 614. The first portion 612 is angled in the second direction and tapers toward an example point 616 in the second angled via 604. In some examples, the second portion 614 is angled substantially perpendicular to the outer surfaces of the glass substrate 302. In some examples, the first portion 612 and the second portion 614 are connected at the point 616. In some examples, the first portion 612 and the second portion 614 differ in dimensions (e.g., width, length, etc.).

FIG. 6B illustrates a top-down view of the example array of antennas 600 in the example glass substrate 302. In the illustrated example, the first angled via 602 and the second angled via 604 have a generally C-shaped cross-section. In other examples, the first angled via 602 and the second angled vias 604 may have any other suitable shape. In the illustrated example of FIG. 6B, the first angled via 602 and the second angled via 604 create an example first antenna element 620 in the array of antennas 600.

Figure 7A:
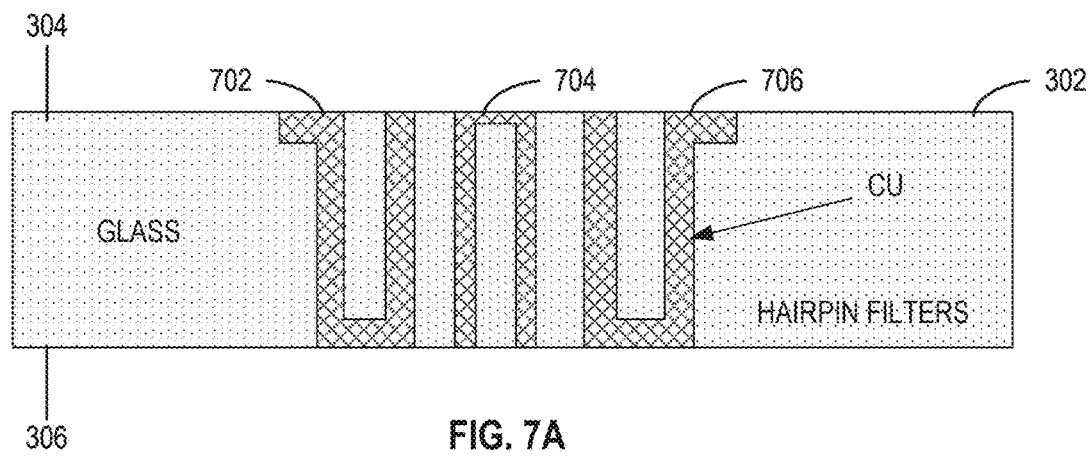
FIGS. 7A, 7B, 7C illustrate the construction of example hairpin filters in different example glass substrates constructed in accordance with teachings of this disclosure.
Figure 7B:
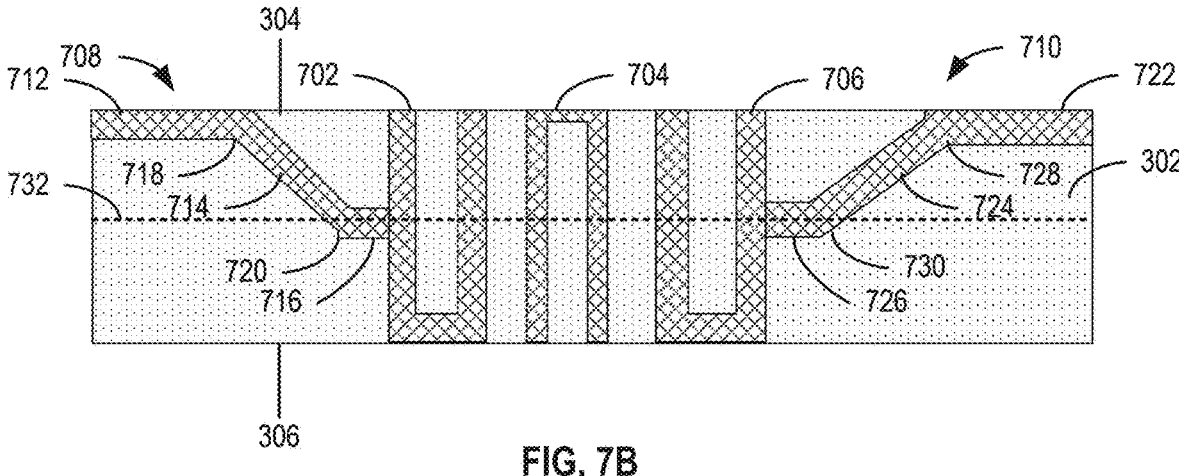
Figure 7C:
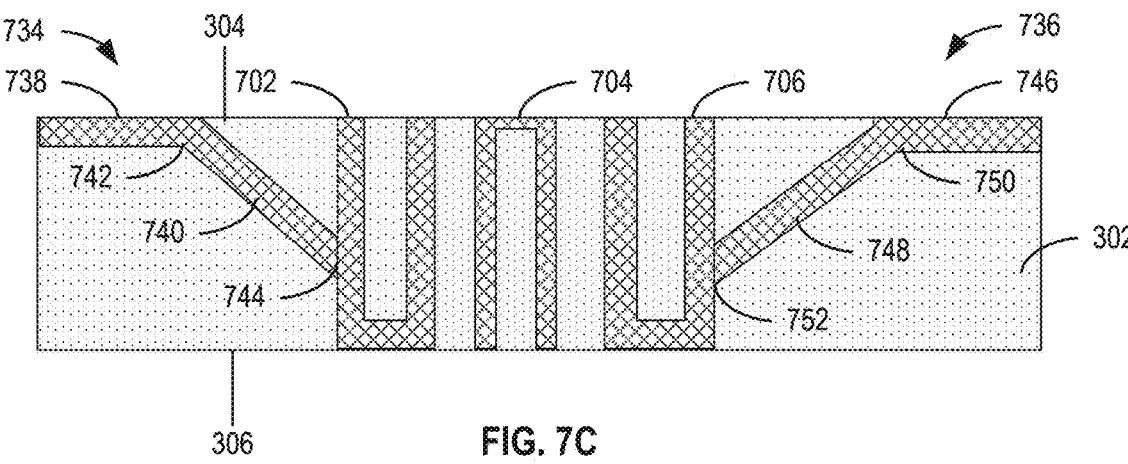

FIGS. 7A, 7B, 7C illustrate the construction of example hairpin filters in the example glass substrate 302 of FIGS. 3A-3D in accordance with the teachings of this disclosure. FIG. 7A illustrates an example first hairpin filter 702, an example second hairpin filter 704, and an example third hairpin filter 706 in the glass substrate 302. In some examples, an adhesion layer and a metal seed layer are deposited in (e.g., on the walls of) the first hairpin filter 702, the second hairpin filter 704, and the third hairpin filter 706 using ALD, and the first hairpin filter 702, the second hairpin filter 704, and the third hairpin filter 706 are electroplated with a metal filling such as, for example, copper (similar to the example first vias 308, the example second vias 314, the example third via 316, the example fourth vias 318, and the example fifth vias 320 of FIGS. 3A-3D). In some examples, the first hairpin filter 702, the second hairpin filter 704, and the third hairpin filter 706 include high aspect ratios (e.g., greater than a six to one ratio, greater than a nine to one ratio, etc.). In some examples, the first hairpin filter 702, the second hairpin filter 704, and the third hairpin filter 706 can include any aspect ratio such as, for example, lower aspect ratios (e.g., an eight to one ratio, a five to one ratio, etc.).

FIG. 7B illustrates the first hairpin filter 702, the second hairpin filter 704, and the third hairpin filter 706 connected to an example first planar-to-angled via 708 and an example second planar-to-angled via 710. In the illustrated example of FIG. 7B, the first planar-to-angled via 708 is conductively connected to the first hairpin filter 702, and the second planar-to-angled via 710 is conductively connected to the third hairpin filter 706. In some examples, an adhesion layer and a metal seed layer are deposited in (e.g., on the walls of) the first and second planar-to-angled vias 708, 710 at the same time as the hairpin filters 702, 704, 706 using ALD, and the first and second planar-to-angled vias 708, 710 are electroplated with a metal filling at the same time as the hairpin filters 702, 704, 706. The example first planar-to-angled via 708 includes an example first portion 712, an example second portion 714, and an example third portion 716. The example first portion 712 extends through the glass substrate 302 substantially parallel to the example top surface 304 of the glass substrate 302. The example second portion 714 extends through the glass substrate 302 at a non-perpendicular and non-parallel angle relative to the first portion 712 (and relative to the top surface 304 of the glass substrate 302). The example third portion 716 extends through the glass substrate 302 substantially parallel to the first portion 712. In some examples, the first portion 712 is connected to an example first side 718 of the second portion 714, and the third portion 716 is connected to an example second side 720 of the second portion 714. In some examples, the third portion 716 is connected to the first hairpin filter 702 at a point that is between and spaced apart from both the top and bottom surfaces 304, 306 of the glass substrate 302.

In the illustrated example of FIG. 7B, the second planar-to-angled via 710 includes an example first portion 722, an example second portion 724, and an example third portion 726. The example first portion 722 extends through the glass substrate 302 substantially parallel to the example top surface 304 of the glass substrate 302. The example second portion 724 extends through the glass substrate 302 at a non-perpendicular and non-parallel angle relative to the first portion 722. The example third portion 726 extends through the glass substrate 302 substantially parallel to the first portion 722. In some examples, the first portion 722 is connected to an example first side 728 of the second portion 724, and the third portion 726 is connected to an example second side 730 of the second portion 724. In some examples, the third portion 726 is connected to the third hairpin filter 706 at a point that is between and spaced apart from both the top and bottom surfaces 304, 306 of the glass substrate 302. In the illustrated example of FIG. 7B, an example dashed line 732 represents possible hybrid bonding in the glass substrate 302, which may include a thin dielectric layer (e.g., SiNx or SiOx) at the dashed line 732. For example, the third portion 716 of the first planar-to-angled via 708 can be hybrid bonded to the first hairpin filter 702, and the third portion 726 of the second planar-to-angled via 710 can be hybrid bonded to the third hairpin filter 706. In this example, based on the shape of the first and second angled vias 708, 710, the angle at the point of connection between the hairpins 702, 706 and the angled vias 708, 710 is substantially perpendicular.

FIG. 7C illustrates the first hairpin filter 702, the second hairpin filter 704, and the third hairpin filter 706 connected to an example first angled via 734 and an example second angled via 736. In the illustrated example of FIG. 7C, the first angled via 734 is conductively connected to the first hairpin filter 702, and the second angled via 736 is conductively connected to the third hairpin filter 706. In some examples, an adhesion layer and a metal seed layer are deposited in (e.g., on the walls of) the first and second angled vias 734, 736 at the same time as the hairpin filters 702, 704, 706 using ALD, and the first and second angled vias 734, 736 are electroplated with a metal filling at the same time as the hairpin filters 702, 704, 706.

The example first angled via 734 includes an example first portion 738 and an example second portion 740. The example first portion 738 extends through the glass substrate

302 substantially parallel to the example top surface 304 of the glass substrate 302. The example second portion 740 extends through the glass substrate 302 at a non-perpendicular and non-parallel angle. In some examples, the first portion 738 is connected to an example first side 742 of the second portion 740, and an example second side 744 of the second portion 740 is connected to the first hairpin filter 702. In some examples, the second angled via 736 includes an example first portion 746 and an example second portion 748. The example first portion 746 extends through the glass substrate 302 substantially parallel to the example top surface 304 of the glass substrate 302. The example second portion 748 extends through the glass substrate 302 at a non-perpendicular and non-parallel angle. In some examples, the first portion 746 is connected to an example first side 750 of the second portion 748, and an example second side 752 of the second portion 748 is connected to the third hairpin filter 706. In this example, based on the shape of the first and second angled vias 734, 736 the angle at the point of connection between the hairpins 702, 706 and the angled vias 734, 736 is non-perpendicular.

Figures 8, 9A, 9B:
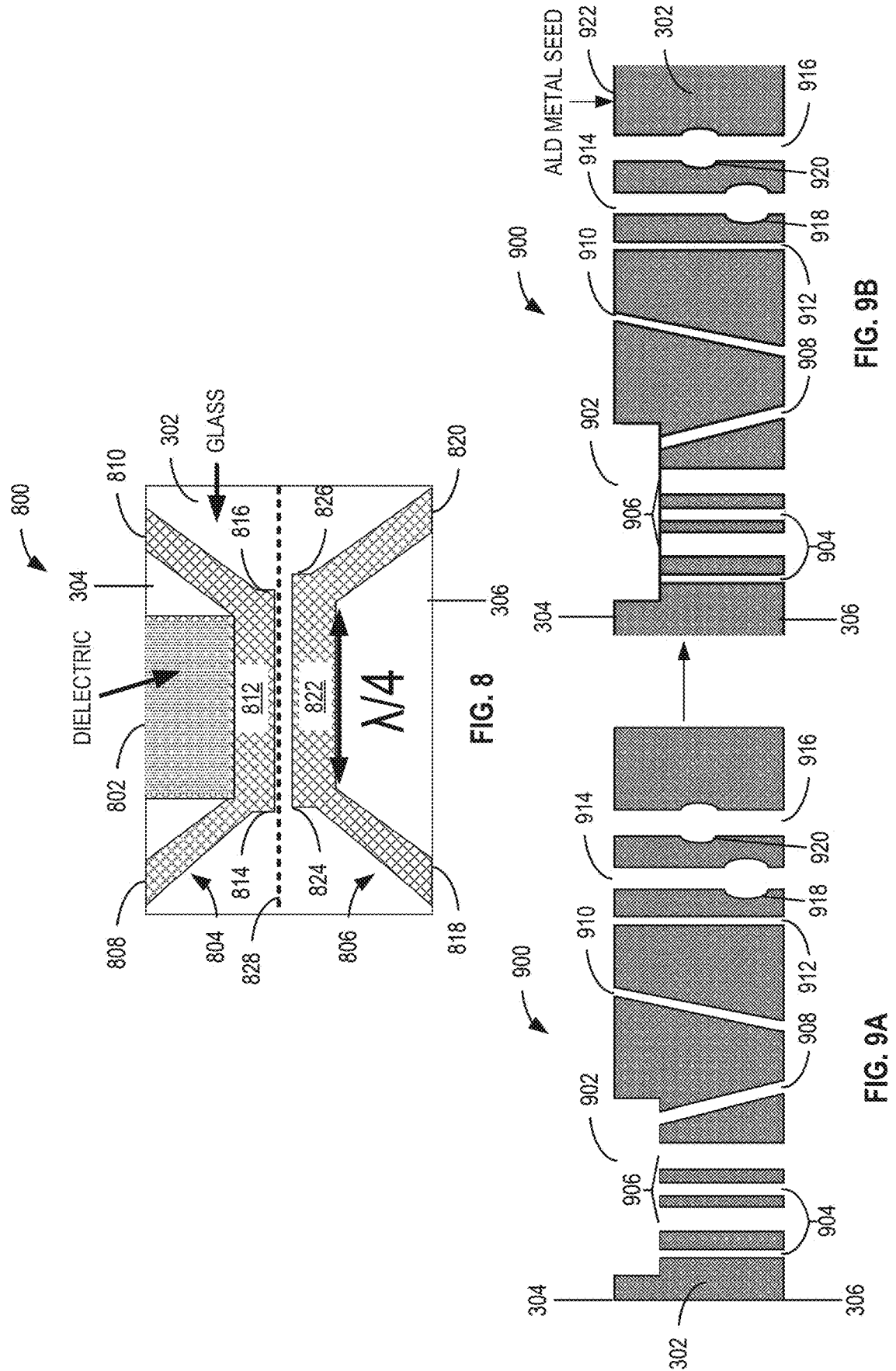
FIG. 8 illustrates an example coupler in a glass substrate constructed in accordance with teachings of this disclosure.
FIGS. 9A, 9B illustrate conformal coating of example vias in a glass substrate in accordance with teachings of this disclosure.

FIG. 8 illustrates an example coupler 800 in the example glass substrate 302 of FIGS. 3A-3D constructed in accordance with teachings of this disclosure. In some examples, the coupler 800 includes an example first via 802, an example second via 804, and an example third via 806. The example first via 802 extends through the glass substrate 302 substantially perpendicular to the top surface 304. In some examples, the first via 802 extends partially through the glass substrate 302 between the top surface 304 and the bottom surface 306. In some examples, an adhesion layer and a metal seed layer are deposited substantially evenly along an inner wall of the first via 802 using ALD similar to the process described in FIG. 3B above. In some examples, the first via 802 is filled with a dielectric plug.

In the example coupler 800 of FIG. 8, the example second via 804 has an example first portion 808, an example second portion 810, and an example third portion 812. In some examples, the first portion 808 extends through the glass substrate 302 at a first non-perpendicular angle. In some examples, the second portion 810 extends through the glass substrate 302 at a second non-perpendicular angle different from the first non-perpendicular angle of the first portion 808. In some examples, the third portion 812 extends through the glass substrate 302 substantially parallel to the top surface 304 and the first via 802. The example third portion 812 includes an example first side 814 and an example second side 816. In some examples, the first portion 808 and the second portion 810 partially extend through the glass substrate 302 between the top surface 304 and the third portion 812. In some examples, the first portion 808 connects to the first side 814 and the second portion 810 connects to the second side 816.

In the example coupler 800 of FIG. 8, the example third via 806 has an example first portion 818, an example second portion 820, and an example third portion 822. In some examples, the first portion 818 extends through the glass substrate 302 at a first non-perpendicular angle. In some examples, the second portion 820 extends through the glass substrate 302 at a second non-perpendicular angle different from the first non-perpendicular angle of the first portion 818. In some examples, the third portion 822 extends through the glass substrate 302 substantially parallel to the bottom surface 306 and the example third portion 812 of the second via 804. The example third portion 822 includes an example first side 824 and an example second side 826. In some examples, the first portion 818 and the second portion

820 partially extend through the glass substrate 302 between the bottom surface 306 and the third portion 822. In some examples, the first portion 818 connects to the first side 824 and the second portion 820 connects to the second side 826.

In the illustrated example, an adhesion layer and a metal seed layer are deposited in the second and third vias 804, 806 using ALD, and the second and third vias 804, 806 are electroplated with a metal filling such as, for example, copper. In some examples, an example dashed line 828 represents possible hybrid bonding between the example third portion 812 of the second via 804 and the example third portion 822 of the third via 806. In some examples, a dielectric layer or an adhesion layer may be included at the dashed line 828 (not shown in FIG. 8). In some examples, the dielectric layer or the adhesion layer can include SiNx, TiOx, TiNx, organic/inorganic polymer, etc.

FIGS. 9A and 9B illustrate conformal coating of vias in the example glass substrate 302 of FIGS. 3A-3D in accordance with teachings of this disclosure. FIG. 9A illustrates an example package substrate 900 that includes a variety of different via/channel designs. The example glass substrate 302 of FIG. 9A includes an example first via 902, example second vias 904, example third vias 906, an example fourth via 908, an example fifth via 910, an example sixth via 912, an example seventh via 914, and an example eighth via 916 that extend through the glass substrate 302 at successively different via diameters, angles (e.g., tilted vias), aspect ratios, pitches, varying internal widths, and/or are connected to blind vias. In some examples, the first via 902 includes an increased internal width compared to the second vias 904, the third vias 906, the fourth via 908, the fifth via 910, the sixth via 912, the seventh via 914, and the eighth via 916. The example first via 902 extends through the glass substrate 302 substantially perpendicular to the top surface 304. In some examples, the first via 902 extends partially through the glass substrate 302 between the top surface 304 and the bottom surface 306.

In the illustrated example of FIG. 9A, the second vias 904 and the third vias 906 are connected to the first via 902. The example second vias 904 and the example third vias 906 extend through the glass substrate between the first via 902 and the bottom surface 306 vertically (e.g., the second and third vias 904, 906 are not angled relative to a direction substantially perpendicular to the top surface 304 of the glass substrate 302). In some examples, the second vias 904 include a first internal width and the third vias 906 include a second internal width different from the first internal width. The example fourth via 908 is connected to the first via 902. In some examples, the fourth via 908 extends through the glass substrate 302 between the first via 902 and the bottom surface 306 at a first non-perpendicular angle. In some examples, the fifth via 910 extends through the glass substrate 302 between the top surface 304 and the bottom surface 306 at a second non-perpendicular angle different from the first non-perpendicular angle of the fourth via 908. In some examples, the fourth via 908 and the fifth via 910 include different internal widths.

In the illustrated example, the sixth via 912 extends through the glass substrate 302 between the top surface 304 and the bottom surface 306 vertically (e.g., the sixth via 912 is not angled relative to a direction substantially perpendicular to the top surface 304 of the glass substrate 302). In the example package substrate 900, the example seventh via 914 and the example eighth via 916 extend through the glass substrate 302 between the top surface 304 and the bottom surface 306 vertically (e.g., the seventh and eighth vias 914, 916 are not angled relative to a direction substantially perpendicular to the top surface 304 of the glass substrate 302). In some examples, the seventh via 914 and the eighth via 916 include a different internal width than the internal width of the sixth via 912. In some examples, the seventh via 914 includes a first non-line of sight feature 918 and the eighth via 916 includes a second non-line of sight feature 920. In the illustrated example, the first non-line of sight feature 918 and the second non-line of sight feature 920 are concave. However, the first non-line of sight feature 918 and the second non-line of sight feature 920 can include any design such as, for example, a convex design.

FIG. 9B illustrates the example package substrate 900 of FIG. 9A including conformal coating of an example metal seed layer 922 using ALD. In the illustrated example, the first via 902, the second vias 904, the third vias 906, the fourth via 908, the fifth via 910, the sixth via 912, the seventh via 914, and the eighth via 916 are conformally coated with an adhesion layer (not shown in FIG. 9B) and the metal seed layer 922. In some examples, an adhesion layer is a thin layer (e.g., 1-20 nm) of a material that adheres to both a glass surface (e.g., the glass substrate 302) and conductive metal surfaces (e.g., TiNx, TiOx, SiNx, carbide, tungsten (W), or any other adhesive material). In some examples, the metal seed layer 922 includes copper (Cu), ruthenium (Ru), cobalt (Co), tungsten (W), or any other conductive films. The adhesion layer and the example metal seed layer 922 are deposited substantially evenly along inner walls of the first via 902, the second vias 904, the third vias 906, the fourth via 908, the fifth via 910, the sixth via 912, the seventh via 914, and the eighth via 916 using ALD similar to the process described in FIG. 3B above. In some examples, the adhesion layer is deposited substantially evenly along inner walls of the first via 902, the second vias 904, the third vias 906, the fourth via 908, the fifth via 910, the sixth via 912, the seventh via 914, and the eighth via 916 concurrently using ALD. Likewise, in some examples, all of the exposed surfaces of all of the various vias 902, 904, 906, 908, 910, 912, 914, 916 are coated with the metal seed layer 326 concurrently (e.g., during a single ALD process).

Figure 10:
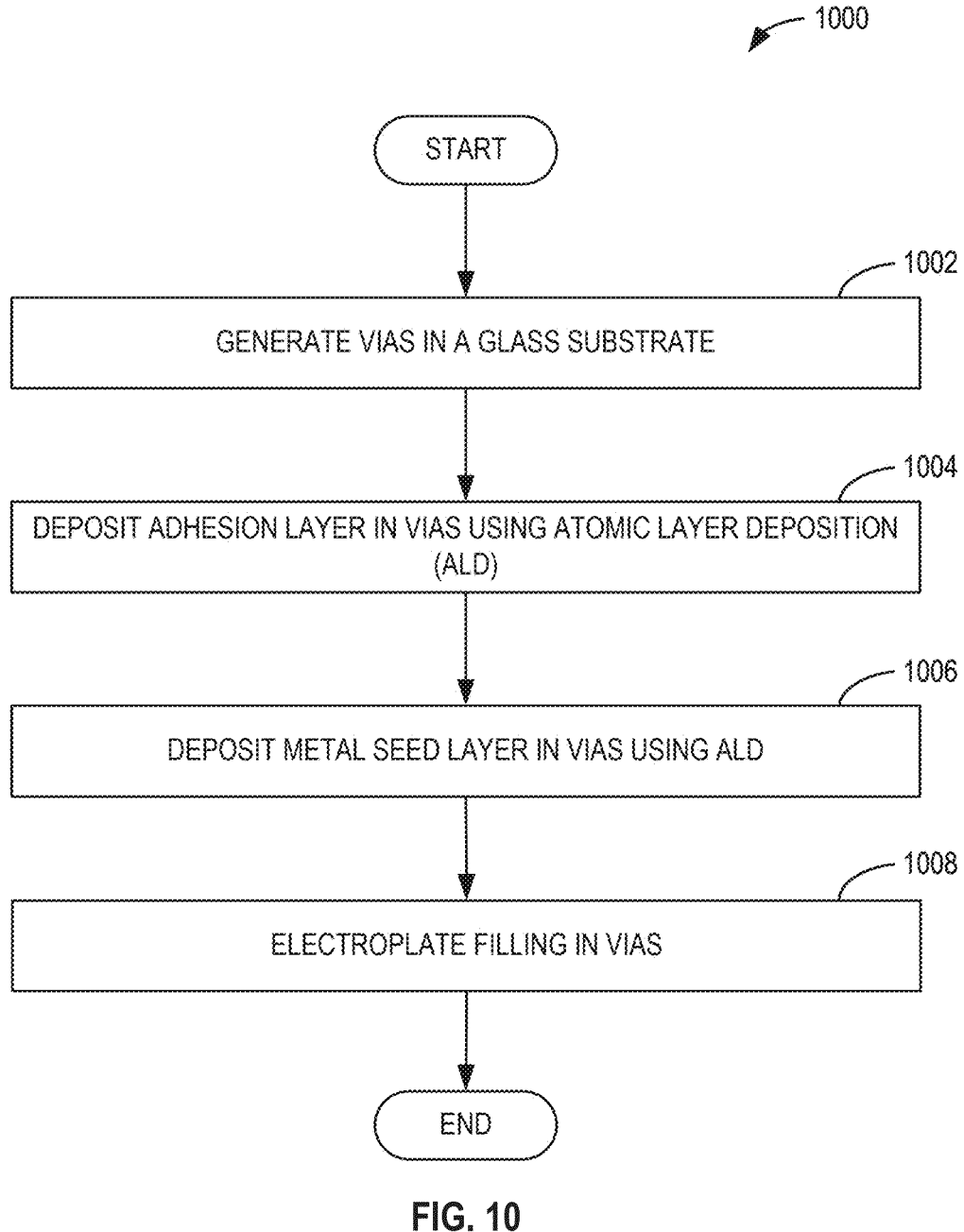
FIG. 10 is a flowchart representative of an example method of manufacturing the vias in a glass substrate in accordance with any of the examples disclosed herein.

FIG. 10 is a flowchart representative of an example method 1000 of manufacturing a glass substrate (e.g., the glass substrate 302) with any of the example vias (e.g., the vias 308, 314, 316, 318, 320, 510, 512, 516, 602, 604, 708, 710, 734, 736, 802, 804, 806, 902, 904, 906, 908, 910, 912, 914, 916) disclosed herein. In some examples, some or all of the operations outlined in the example method 1000 are performed automatically by fabrication equipment that is programmed to perform the operations. Although the example method of manufacturing is described with reference to the flowchart illustrated in FIG. 10, many other methods may alternatively be used. For example, the order of execution of the blocks may be changed, and/or some of the blocks described may be combined, divided, re-arranged, omitted, eliminated, and/or implemented in any other way.

The example method 1000 of FIG. 10 begins at block 1002 by generating vias (e.g., the vias 308, 314, 316, 318, 320, 510, 512, 516, 602, 604, 708, 710, 734, 736, 802, 804, 806, 902, 904, 906, 908, 910, 912, 914, 916) in a glass substrate (e.g., the example glass substrate 302). In some examples, the vias are generated in the glass substrate using laser-assisted etching technique(s) illustrated in FIGS. 1A-1C. In some examples, an array of vias are generated to extend through the glass substrate at successively different angles, pitches, etc. In some examples, the generated vias can have different angles, pitches, dimensions (e.g., widths, length, etc.), non-line of sight features, etc., as described above in connection with FIGS. 3A-9B. In some examples, the vias generated in the glass substrate include high aspect ratios. In some examples, a high aspect ratio is greater than a nine to one ratio (e.g., a ten to one ratio, a fifteen to one ratio, a twenty to one ratio, etc.). In some examples, a high aspect ratio can be greater than a six to one ratio.

At block 1004, the example method 1000 includes depositing an adhesion layer in (e.g., on the walls of) the vias (e.g., the vias 308, 314, 316, 318, 320, 510, 512, 516, 602, 604, 708, 710, 734, 736, 802, 804, 806, 902, 904, 906, 908, 910, 912, 914, 916) using ALD. In some examples, an adhesion layer is a thin layer (e.g., 1-20 nm) of a material that adheres to both a glass surface (e.g., the glass substrate 302) and conductive metal surfaces (e.g., titanium nitride (TiNx), titanium oxide (TiOx), silicon nitride (SiNx), carbide, tungsten (W), or any other adhesive material). In some examples, the adhesion layer is deposited substantially evenly along the inner walls of the vias/channels, where the adhesion layer separates the metal seed layer 326 from the inner walls of the vias/channels.

At block 1006, the example method 1000 includes depositing a metal seed layer in the vias (e.g., the vias 308, 314, 316, 318, 320, 510, 512, 516, 602, 604, 708, 710, 734, 736, 802, 804, 806, 902, 904, 906, 908, 910, 912, 914, 916) using ALD. In some examples, the metal seed layer 326 includes copper (Cu), ruthenium (Ru), tungsten (W), or any other conductive films. In some examples, the metal seed layer 326 can be 1-50 nm thick. In some examples, a metal seed layer is deposited substantially evenly along inner walls of the vias/channels. In some examples, the metal seed layer consistently conforms to the different angles, pitches, dimensions, etc. of the different surfaces/walls of the vias/channels concurrently.

At block 1008, the example method 1000 includes electroplating a filling in the vias (e.g., the vias 308, 314, 316, 318, 320, 510, 512, 516, 602, 604, 708, 710, 734, 736, 802, 804, 806, 902, 904, 906, 908, 910, 912, 914, 916). In some examples, the vias/channels are electroplated and/or filled with a filling after the conformal coating of the metal seed layer. In some examples, the filling is a metal such as, for example, copper. However, the filling can be any other conductive metals, dielectrics, nitrides, and/or oxides.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

The example vias in the example glass substrate 302 disclosed herein may be included in any suitable electronic component. FIGS. 11-15 illustrate various examples of apparatus that may include, or be included in, the example glass substrate 302 with any of the example vias 308, 314, 316, 318, 320, 510, 512, 516, 602, 604, 708, 710, 734, 736, 802, 804, 806, 902, 904, 906, 908, 910, 912, 914, 916 of FIGS. 3A-3D, 4, 5A, 5B, 6A, 6B, 7A-7C, 8, 9A, and 9B disclosed herein.

Figure 11:
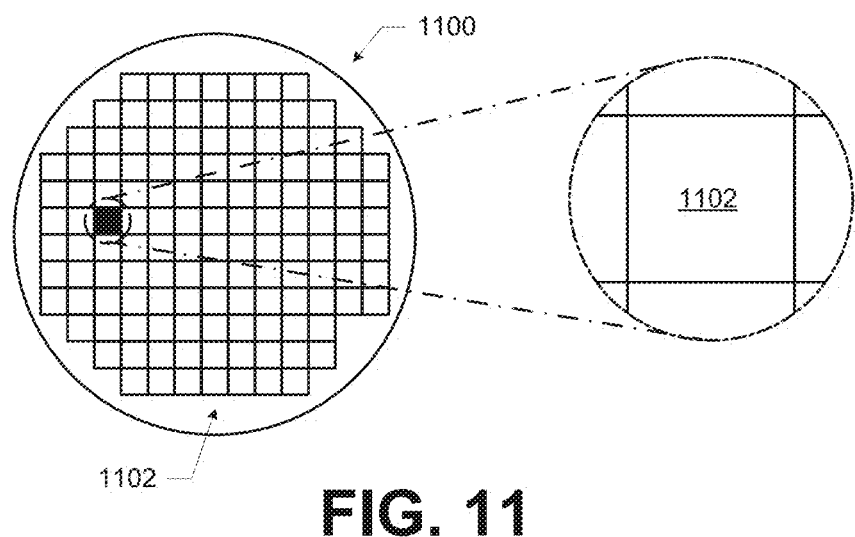
FIG. 11 is a top view of a wafer and dies that may be included in an IC package constructed in accordance with any of the examples disclosed herein.

FIG. 11 is a top view of a wafer 1100 and dies 1102 that may be included in an example IC package that is constructed to include any of the example glass substrate 302 of any one of FIGS. 3A-3D, 4, 5A, 5B, 6A, 6B, 7A-7C, 8, 9A, and 9B, or may be included in an IC package whose substrate includes one or more vias (e.g., as discussed below with reference to FIG. 13) in accordance with any of the examples disclosed herein. The wafer 1100 may be composed of semiconductor material and may include one or more dies 1102 having IC structures formed on a surface of the wafer 1100. Each of the dies 1102 may be a repeating unit of a semiconductor product that includes any suitable IC. After the fabrication of the semiconductor product is complete, the wafer 1100 may undergo a singulation process in which the dies 1102 are separated from one another to provide discrete "chips" of the semiconductor product. The die 1102 may include one or more transistors (e.g., some of the transistors 1240 of FIG. 12, discussed below), supporting circuitry to route electrical signals to the transistors, passive components (e.g., signal traces, resistors, capacitors, or inductors), and/or any other IC components. In some examples, the wafer 1100 or the die 1102 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 1402 of FIG. 14) or other logic that is configured to store information in the memory devices or execute instructions stored in the memory array.

Figure 12:
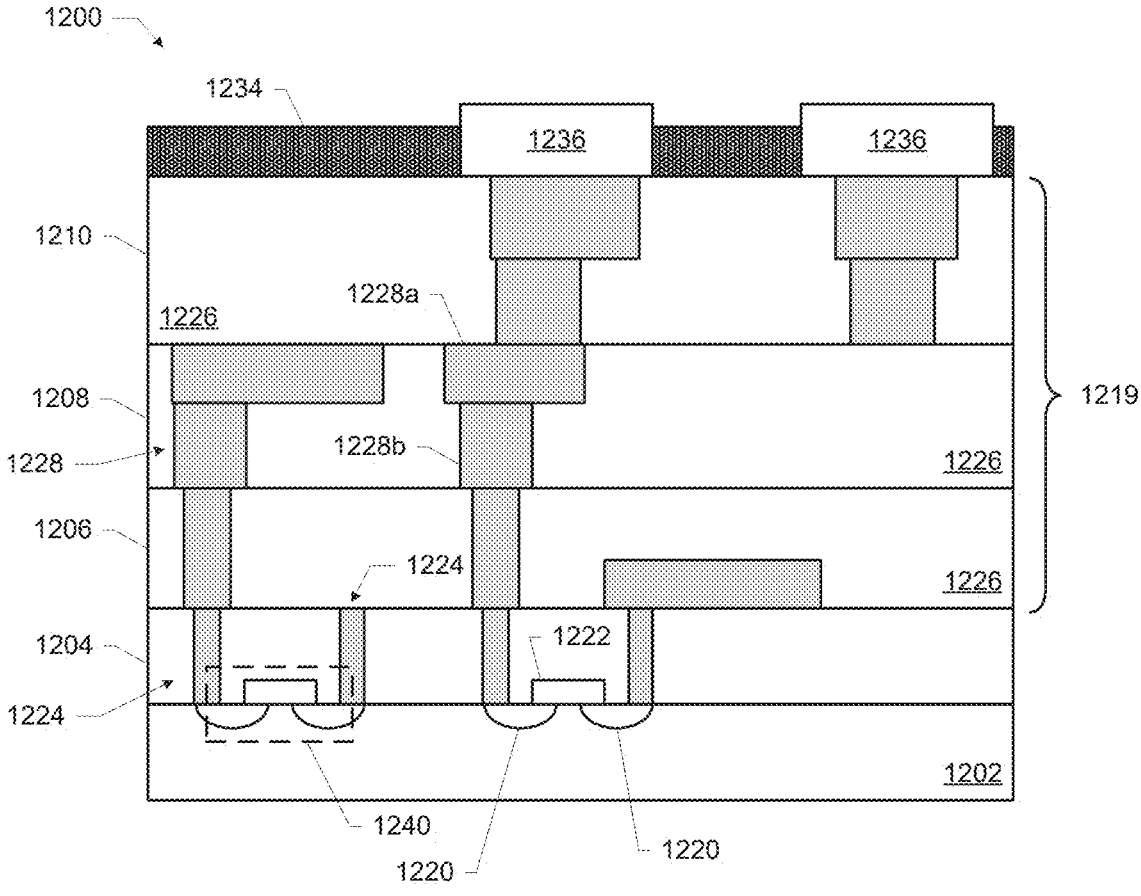
FIG. 12 is a cross-sectional side view of an IC device that may include an IC package constructed in accordance with any of the examples disclosed herein.

FIG. 12 is a cross-sectional side view of an IC device 1200 that may be included in an IC package with a package substrate (e.g., the example glass substrate 302 of FIGS. 3A-3D, 4, 5A, 5B, 6A, 6B, 7A-7C, 8, 9A, and 9B) that includes one or more of the example vias (e.g., the vias 308, 314, 316, 318, 320, 510, 512, 516, 602, 604, 708, 710, 734, 736, 802, 804, 806, 902, 904, 906, 908, 910, 912, 914, 916) in accordance with any of the examples disclosed herein. One or more of the IC devices 1200 may be included in one or more dies 1102 (FIG. 11). The IC device 1200 may be formed on a die substrate 1202 (e.g., the wafer 1100 of FIG. 11) and may be included in a die (e.g., the die 1102 of FIG. 11). The die substrate 1202 may be a semiconductor substrate composed of semiconductor material systems including, for example, n-type or p-type materials systems (or a combination of both). The die substrate 1202 may include, for example, a crystalline substrate formed using a bulk silicon or a silicon-on-insulator (SOI) substructure. In some examples, the die substrate 1202 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the die substrate 1202. Although a few examples of materials from which the die substrate 1202 may be formed are described here, any material that may serve as a foundation for an IC device 1200 may be used. The die substrate 1202 may be part of a singulated die (e.g., the dies 1102 of FIG. 11) or a wafer (e.g., the wafer 1100 of FIG. 11).

The IC device 1200 may include one or more device layers 1204 disposed on the substrate 1202. The device layer 1204 may include features of one or more transistors 1240 (e.g., metal oxide semiconductor field-effect transistors (MOSFETs)) formed on the die substrate 1202. The device layer 1204 may include, for example, one or more source and/or drain (S/D) regions 1220, a gate 1222 to control current flow in the transistors 1240 between the S/D regions 1220, and one or more S/D contacts 1224 to route electrical signals to/from the S/D regions 1220. The transistors 1240 may include additional features not depicted for the sake of clarity, such as device isolation regions, gate contacts, and the like. The transistors 1240 are not limited to the type and configuration depicted in FIG. 12 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1240 may include a gate 1222 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some examples, an annealing process may be carried out on the gate dielectric to improve its quality when a high-k material is used.

The gate electrode may be formed on the gate dielectric and may include at least one p-type work function metal or n-type work function metal, depending on whether the transistor 1240 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide), and any of the metals discussed above with reference to a PMOS transistor (e.g., for work function tuning).

In some examples, when viewed as a cross-section of the transistor 1240 along the source-channel-drain direction, the gate electrode may consist of a U-shaped structure that includes a bottom portion substantially parallel to the surface of the substrate and two sidewall portions that are substantially perpendicular to the top surface of the substrate. In other examples, at least one of the metal layers that form the gate electrode may simply be a planar layer that is substantially parallel to the top surface of the substrate and does not include sidewall portions substantially perpendicular to the top surface of the substrate. In other examples, the gate electrode may consist of a combination of U-shaped structures and planar, non-U-shaped structures. For example, the gate electrode may consist of one or more U-shaped metal layers formed atop one or more planar, non-U-shaped layers.

In some examples, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some examples, a plurality of spacer pairs may be used; for instance, two pairs, three pairs, or four pairs of sidewall spacers may be formed on opposing sides of the gate stack.

The S/D regions 1220 may be formed within the die substrate 1202 adjacent to the gate 1222 of each transistor 1240. The S/D regions 1220 may be formed using an implantation/diffusion process or an etching/deposition process, for example. In the former process, dopants such as boron, aluminum, antimony, phosphorous, or arsenic may be ion-implanted into the die substrate 1202 to form the S/D regions 1220. An annealing process that activates the dopants and causes them to diffuse farther into the die substrate 1202 may follow the ion-implantation process. In the latter process, the die substrate 1202 may first be etched to form recesses at the locations of the S/D regions 1220. An epitaxial deposition process may then be carried out to fill the recesses with material that is used to fabricate the S/D regions 1220. In some implementations, the S/D regions 1220 may be fabricated using a silicon alloy such as silicon germanium or silicon carbide. In some examples, the epitaxially deposited silicon alloy may be doped in situ with dopants such as boron, arsenic, or phosphorous. In some examples, the S/D regions 1220 may be formed using one or more alternate semiconductor materials such as germanium or a group III-V material or alloy. In further examples, one or more layers of metal and/or metal alloys may be used to form the S/D regions 1220.

Electrical signals, such as power and/or input/output (I/O) signals, may be routed to and/or from the devices (e.g., transistors 1240) of the device layer 1204 through one or more interconnect layers disposed on the device layer 1204 (illustrated in FIG. 12 as interconnect layers 1206-1210). For example, electrically conductive features of the device layer 1204 (e.g., the gate 1222 and the S/D contacts 1224) may be electrically coupled with the interconnect structures 1228 of the interconnect layers 1206-1210. The one or more interconnect layers 1206-1210 may form a metallization stack (also referred to as an "ILD stack") 1219 of the IC device 1200.

The interconnect structures 1228 may be arranged within the interconnect layers 1206-1210 to route electrical signals according to a wide variety of designs (in particular, the arrangement is not limited to the particular configuration of interconnect structures 1228 depicted in FIG. 12). Although a particular number of interconnect layers 1206-1210 is depicted in FIG. 12, examples of the present disclosure include IC devices having more or fewer interconnect layers than depicted.

In some examples, the interconnect structures 1228 may include lines 1228*a* and/or vias 1228*b* filled with an electrically conductive material such as a metal. In some examples, the vias 1228*b* may include the first vias 308, the second vias 314, the third via 316, the fourth vias 318, the fifth vias 320, the first angled via 510, second angled via 512, vertical via 516, first angled via 602, second angled via 604, first planar-to-angled via 708, second planar-to-angled via 710, first angled via 734, second angled via 736, first via 802, second via 804, third via 806, first via 902, second vias 904, third vias 906, fourth via 908, fifth via 910, sixth via 912, seventh via 914, and/or eighth via 916 of FIGS. 3A-3D, 4, 5A, 5B, 6A, 6B, 7A-7C, 8, 9A, and 9B. The lines 1228*a* may be arranged to route electrical signals in a direction of a plane that is substantially parallel with a surface of the die substrate 1202 upon which the device layer 1204 is formed. For example, the lines 1228*a* may route electrical signals in a direction in and out of the page from the perspective of FIG. 12. The vias 1228*b* may be arranged to route electrical signals in a direction of a plane that is substantially perpendicular to the surface of the die substrate 1202 upon which the device layer 1204 is formed. In some examples, the vias 1228*b* may electrically couple lines 1228*a* of different interconnect layers 1206-1210 together.

The interconnect layers 1206-1210 may include a dielectric material 1226 disposed between the interconnect structures 1228, as shown in FIG. 12. In some examples, the dielectric material 1226 disposed between the interconnect structures 1228 in different ones of the interconnect layers 1206-1210 may have different compositions; in other examples, the composition of the dielectric material 1226 between different interconnect layers 1206-1210 may be the same.

A first interconnect layer 1206 (referred to as Metal 1 or "M1") may be formed directly on the device layer 1204. In some examples, the first interconnect layer 1206 may include lines 1228*a* and/or vias 1228*b*, as shown. The lines 1228*a* of the first interconnect layer 1206 may be coupled with contacts (e.g., the S/D contacts 1224) of the device layer 1204.

A second interconnect layer 1208 (referred to as Metal 2 or "M2") may be formed directly on the first interconnect layer 1206. In some examples, the second interconnect layer 1208 may include vias 1228*b* to couple the lines 1228*a* of the second interconnect layer 1208 with the lines 1228*a* of the first interconnect layer 1206. Although the lines 1228*a* and the vias 1228*b* are structurally delineated with a line within each interconnect layer (e.g., within the second interconnect layer 1208) for the sake of clarity, the lines 1228*a* and the vias 1228*b* may be structurally and/or materially contiguous (e.g., simultaneously filled during a dual-damascene process) in some examples.

A third interconnect layer 1210 (referred to as Metal 3 or "M3") (and additional interconnect layers, as desired) may be formed in succession on the second interconnect layer 1208 according to similar techniques and configurations described in connection with the second interconnect layer 1208 or the first interconnect layer 1206. In some examples, the interconnect layers that are "higher up" in the metallization stack 1219 in the IC device 1200 (i.e., further away from the device layer 1204) may be thicker.

The IC device 1200 may include a solder resist material 1234 (e.g., polyimide or similar material) and one or more conductive contacts 1236 formed on the interconnect layers 1206-1210. In FIG. 12, the conductive contacts 1236 are illustrated as taking the form of bond pads. The conductive contacts 1236 may be electrically coupled with the interconnect structures 1228 and configured to route the electrical signals of the transistor(s) 1240 to other external devices. For example, solder bonds may be formed on the one or more conductive contacts 1236 to mechanically and/or electrically couple a chip including the IC device 1200 with another component (e.g., a circuit board). The IC device 1200 may include additional or alternate structures to route the electrical signals from the interconnect layers 1206-1210; for example, the conductive contacts 1236 may include other analogous features (e.g., posts) that route the electrical signals to external components.

In other examples in which the IC device 1200 is a double-sided die, the IS device 1200 may include one or more TSVs through the die substrate 1202; these TSVs may make contact with the device layer(s) 1204, and may provide conductive pathways between the device layer(s) 1204 and additional conductive contacts (not shown) on the opposite side of the IC device 1200 from the conductive contacts 1236.

Figure 13:
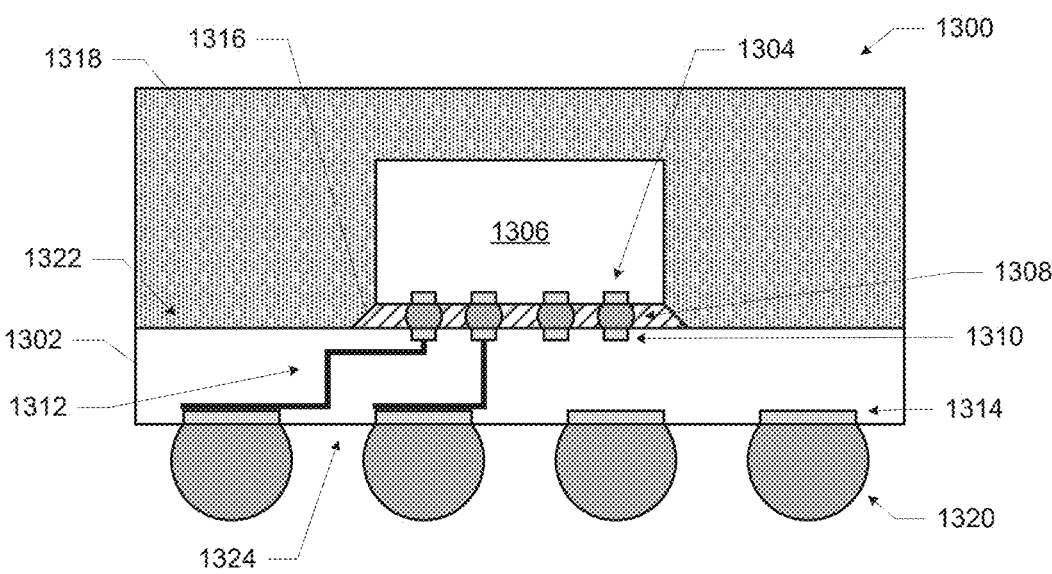
FIG. 13 is a cross-sectional side view of an IC package that may include an IC substrate, in accordance with any of the examples disclosed herein.

FIG. 13 is a cross-sectional view of an example IC package 1300 that may include a package substrate 1302. In some examples, the package substrate 1302 corresponds to the example glass substrate 302 of FIGS. 3A-3D, 4, 5A, 5B, 6A, 6B, 7A-7C, 8, 9A, and 9B that includes one or more of the example vias 308, 314, 316, 318, 320, 510, 512, 516, 602, 604, 708, 710, 734, 736, 802, 804, 806, 902, 904, 906, 908, 910, 912, 914, 916 disclosed herein. The package substrate 1302 (e.g., the example glass substrate 302) may be formed of a dielectric material, and may have conductive pathways extending through the dielectric material between upper and lower faces 1322, 1324, or between different locations on the upper face 1322, and/or between different locations on the lower face 1324. These conductive pathways may take the form of any of the interconnects 1228 discussed above with reference to FIG. 12.

The IC package 1300 may include a die 1306 coupled to the package substrate 1302 via conductive contacts 1304 of the die 1306, first-level interconnects 1308, and conductive contacts 1310 of the package substrate 1302. The conductive contacts 1310 may be coupled to conductive pathways 1312 through the package substrate 1302, allowing circuitry within the die 1306 to electrically couple to various ones of the conductive contacts 1314 (or to other devices included in the package substrate 1302, not shown). The first-level interconnects 1308 illustrated in FIG. 13 are solder bumps, but any suitable first-level interconnects 1308 may be used. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket).

In some examples, an underfill material 1316 may be disposed between the die 1306 and the package substrate 1302 around the first-level interconnects 1308, and a mold compound 1318 may be disposed around the die 1306 and in contact with the package substrate 1302. In some examples, the underfill material 1316 may be the same as the mold compound 1318. Example materials that may be used for the underfill material 1316 and the mold compound 1318 are epoxy mold materials, as suitable. Second-level interconnects 1320 may be coupled to the conductive contacts 1314. The second-level interconnects 1320 illustrated in FIG. 13 are solder balls (e.g., for a ball grid array arrangement), but any suitable second-level interconnects 1320 may be used (e.g., pins in a pin grid array arrangement or lands in a land grid array arrangement). The second-level interconnects 1320 may be used to couple the IC package 1300 to another component, such as a circuit board (e.g., a motherboard), an interposer, or another IC package, as known in the art and as discussed below with reference to FIG. 14.

In FIG. 13, the IC package 1300 is a flip chip package. The number and location of vias in the package substrate 1302 of the IC package 1300 is simply illustrative, and any number of example vias (with any suitable structure) may be included in the package substrate 1302. The die 1306 may take the form of any of the examples of the die 1102 discussed herein (e.g., may include any of the examples of the IC device 1200).

Although the IC package 1300 illustrated in FIG. 13 is a flip chip package, other package architectures may be used. For example, the IC package 1300 may be a ball grid array (BGA) package, such as an embedded wafer-level ball grid array (eWLB) package. In another example, the IC package 1300 may be a wafer-level chip scale package (WLCSP) or a panel fanout (FO) package. Although a single die 1306 is illustrated in the IC package 1300 of FIG. 13, an IC package 1300 may include multiple dies 1306 (e.g., with one or more of the multiple dies 1306 coupled to the example vias included in the package substrate 1302). An IC package 1300 may include additional passive components, such as surface-mount resistors, capacitors, and inductors disposed on the first face 1322 or the second face 1324 of the package substrate 1302. More generally, an IC package 1300 may include any other active or passive components known in the art.

Figure 14:
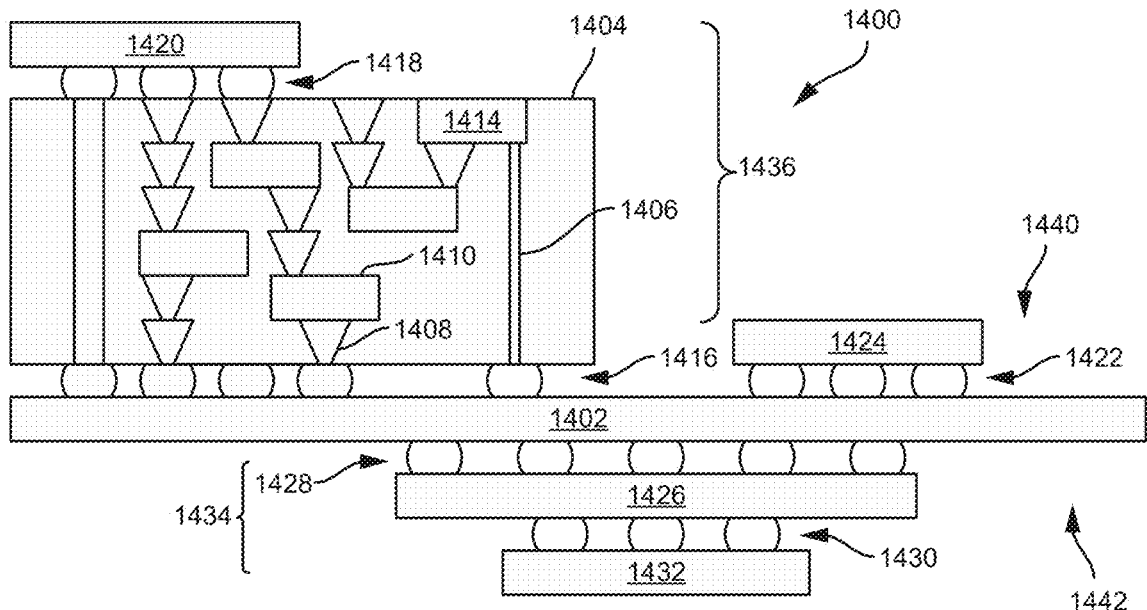
FIG. 14 is a cross-sectional side view of an IC device assembly that may include an IC package constructed in accordance with any of the examples disclosed herein.

FIG. 14 is a cross-sectional side view of an IC device assembly 1400 that may include one or more IC packages or other electronic components (e.g., a die) including a glass substrate (e.g., the glass substrate 302) with one or more of the example vias (e.g., the vias 308, 314, 316, 318, 320, 510,

512, 516, 602, 604, 708, 710, 734, 736, 802, 804, 806, 902, 904, 906, 908, 910, 912, 914, 916) of FIGS. 3A-3D, 4, 5A, 5B, 6A, 6B, 7A-7C, 8, 9A, and 9B, in accordance with any of the examples disclosed herein. The IC device assembly 1400 includes a number of components disposed on a circuit board 1402 (which may be, for example, a motherboard). The IC device assembly 1400 includes components disposed on a first face 1440 of the circuit board 1402 and an opposing second face 1442 of the circuit board 1402; generally, components may be disposed on one or both faces 1440 and 1442. Any of the IC packages discussed below with reference to the IC device assembly 1400 may take the form of any suitable ones of the examples of the IC package 1300 discussed above with reference to FIG. 13 (e.g., that includes the example glass substrate 302 of FIGS. 3A-3D, 4, 5A, 5B, 6A, 6B, 7A-7C, 8, 9A, and 9B disclosed herein).

In some examples, the circuit board 1402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1402. In other examples, the circuit board 1402 may be a non-PCB substrate.

The IC device assembly 1400 illustrated in FIG. 14 includes a package-on-interposer structure 1436 coupled to the first face 1440 of the circuit board 1402 by coupling components 1416. The coupling components 1416 may electrically and mechanically couple the package-on-interposer structure 1436 to the circuit board 1402, and may include solder balls (as shown in FIG. 14), male and female portions of a socket, an adhesive, an underfill material, and/or any other suitable electrical and/or mechanical coupling structure.

The package-on-interposer structure 1436 may include an IC package 1420 coupled to an interposer 1404 by coupling components 1418. The coupling components 1418 may take any suitable form for the application, such as the forms discussed above with reference to the coupling components 1416. Although a single IC package 1420 is shown in FIG. 14, multiple IC packages may be coupled to the interposer 1404; indeed, additional interposers may be coupled to the interposer 1404. The interposer 1404 may provide an intervening substrate used to bridge the circuit board 1402 and the IC package 1420. The IC package 1420 may be or include, for example, a die (the die 1102 of FIG. 11), an IC device (e.g., the IC device 1200 of FIG. 12), or any other suitable component. Generally, the interposer 1404 may spread a connection to a wider pitch or reroute a connection to a different connection. For example, the interposer 1404 may couple the IC package 1420 (e.g., a die) to a set of BGA conductive contacts of the coupling components 1416 for coupling to the circuit board 1402. In the example illustrated in FIG. 14, the IC package 1420 and the circuit board 1402 are attached to opposing sides of the interposer 1404; in other examples, the IC package 1420 and the circuit board 1402 may be attached to a same side of the interposer 1404. In some examples, three or more components may be interconnected by way of the interposer 1404.

In some examples, the interposer 1404 may be formed of an epoxy resin, a fiberglass-reinforced epoxy resin, an epoxy resin with inorganic fillers, a ceramic material, or a polymer material such as polyimide. In some examples, the interposer 1404 may be formed of alternate rigid or flexible materials that may include the same materials described above for use in a semiconductor substrate, such as silicon, germanium, and other group III-V and group IV materials. The interposer 1404 may include metal interconnects 1408 and vias 1410, including but not limited to through-silicon vias (TSVs) 1406. The interposer 1404 may further include embedded devices 1414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1404. The package-on-interposer structure 1436 may take the form of any of the package-on-interposer structures known in the art.

The IC device assembly 1400 may include an IC package 1424 coupled to the first face 1440 of the circuit board 1402 by coupling components 1422. The coupling components 1422 may take the form of any of the examples discussed above with reference to the coupling components 1416, and the IC package 1424 may take the form of any of the examples discussed above with reference to the IC package 1420.

The IC device assembly 1400 illustrated in FIG. 14 includes a package-on-package structure 1434 coupled to the second face 1442 of the circuit board 1402 by coupling components 1428. The package-on-package structure 1434 may include a first IC package 1426 and a second IC package 1432 coupled together by coupling components 1430 such that the first IC package 1426 is disposed between the circuit board 1402 and the second IC package 1432. The coupling components 1428, 1430 may take the form of any of the examples of the coupling components 1416 discussed above, and the IC packages 1426, 1432 may take the form of any of the examples of the IC package 1420 discussed above. The package-on-package structure 1434 may be configured in accordance with any of the package-on-package structures known in the art.

Figure 15:
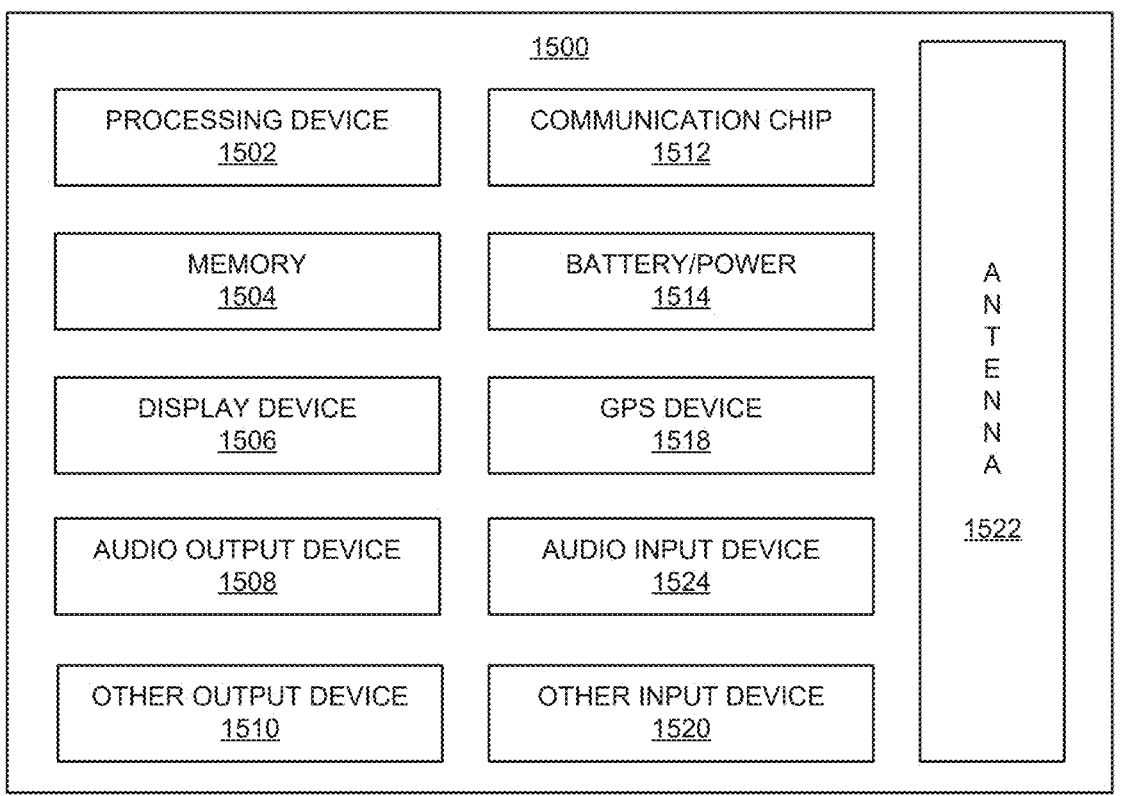
FIG. 15 is a block diagram of an example electrical device that may include an IC package constructed in accordance with any of the examples disclosed herein.

FIG. 15 is a block diagram of an example electrical device 1500 that may include the example glass substrate 302 of FIGS. 3A-3D, 4, 5A, 5B, 6A, 6B, 7A-7C, 8, 9A, and 9B, in accordance with any of the examples disclosed herein. For example, any suitable ones of the components of the electrical device 1500 may include one or more of the IC packages 1300, IC devices 1200, or dies 1102 disclosed herein. A number of components are illustrated in FIG. 15 as included in the electrical device 1500, but any one or more of these components may be omitted or duplicated, as suitable for the application. In some examples, some or all of the components included in the electrical device 1500 may be attached to one or more motherboards. In some examples, some or all of these components are fabricated onto a single system-on-a-chip (SoC) die.

Additionally, in various examples, the electrical device 1500 may not include one or more of the components illustrated in FIG. 15, but the electrical device 1500 may include interface circuitry for coupling to the one or more components. For example, the electrical device 1500 may not include a display device 1506, but may include display device interface circuitry (e.g., a connector and driver circuitry) to which a display device 1506 may be coupled. In another set of examples, the electrical device 1500 may not include an audio input device 1524 or an audio output device 1508, but may include audio input or output device interface circuitry (e.g., connectors and supporting circuitry) to which an audio input device 1524 or audio output device 1508 may be coupled.

The electrical device 1500 may include a processing device 1502 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1502 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1500 may include a memory 1504, which may itself include one or more memory devices such as volatile memory (e.g., dynamic random access memory (DRAM)), nonvolatile memory (e.g., read-only memory (ROM)), flash memory, solid state memory, and/or a hard drive. In some examples, the memory 1504 may include memory that shares a die with the processing device 1502. This memory may be used as cache memory and may include embedded dynamic random access memory (eDRAM) or spin transfer torque magnetic random access memory (STT-MRAM).

In some examples, the electrical device 1500 may include a communication chip 1512 (e.g., one or more communication chips). For example, the communication chip 1512 may be configured for managing wireless communications for the transfer of data to and from the electrical device 1500. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some examples they might not.

The communication chip 1512 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1512 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1512 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1512 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1512 may operate in accordance with other wireless protocols in other examples.

The electrical device 1500 may include an antenna 1522 to facilitate wireless communications and/or to receive other wireless communications (such as AM or FM radio transmissions).

In some examples, the communication chip 1512 may manage wired communications, such as electrical, optical, or any other suitable communication protocols (e.g., the Ethernet). As noted above, the communication chip 1512 may include multiple communication chips. For instance, a first communication chip 1512 may be dedicated to shorter-range wireless communications such as Wi-Fi or Bluetooth, and a second communication chip 1512 may be dedicated to longer-range wireless communications such as global positioning system (GPS), EDGE, GPRS, CDMA, WiMAX, LTE, EV-DO, or others. In some examples, a first communication chip 1512 may be dedicated to wireless communications, and a second communication chip 1512 may be dedicated to wired communications.

The electrical device 1500 may include battery/power circuitry 1514. The battery/power circuitry 1514 may include one or more energy storage devices (e.g., batteries or capacitors) and/or circuitry for coupling components of the electrical device 1500 to an energy source separate from the electrical device 1500 (e.g., AC line power).

The electrical device 1500 may include a display device 1506 (or corresponding interface circuitry, as discussed above). The display device 1506 may include any visual indicators, such as a heads-up display, a computer monitor, a projector, a touchscreen display, a liquid crystal display (LCD), a light-emitting diode display, or a flat panel display.

The electrical device 1500 may include an audio output device 1508 (or corresponding interface circuitry, as discussed above). The audio output device 1508 may include any device that generates an audible indicator, such as speakers, headsets, or earbuds.

The electrical device 1500 may include an audio input device 1524 (or corresponding interface circuitry, as discussed above). The audio input device 1524 may include any device that generates a signal representative of a sound, such as microphones, microphone arrays, or digital instruments (e.g., instruments having a musical instrument digital interface (MIDI) output).

The electrical device 1500 may include a GPS device 1518 (or corresponding interface circuitry, as discussed above). The GPS device 1518 may be in communication with a satellite-based system and may receive a location of the electrical device 1500, as known in the art.

The electrical device 1500 may include any other output device 1510 (or corresponding interface circuitry, as discussed above). Examples of the other output device 1510 may include an audio codec, a video codec, a printer, a wired or wireless transmitter for providing information to other devices, or an additional storage device.

The electrical device 1500 may include any other input device 1520 (or corresponding interface circuitry, as discussed above). Examples of the other input device 1520 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1500 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some examples, the electrical device 1500 may be any other electronic device that processes data.

From the foregoing, it will be appreciated that example systems, methods, apparatus, and articles of manufacture have been disclosed that produce high aspect ratio through glass vias using ALD. Examples disclosed herein use a conformal film deposition method (e.g., ALD) to conformally metalize channels/vias that are angled/tilted, narrowed, shaped, etc. for use in different applications. Advantageously, the disclosed systems, methods, apparatus, and articles of manufacture improve the efficiency of using a computing device by enabling the simultaneous, conformal/uniform metallization in the inner walls of vias/channels and the coating of the vias/channels that have variations in the shape, size, angle, aspect ratio, etc., thus improving the via/channel connections in a glass substrate of a given microelectronic package and, as a result, improving connectivity and speed of communication therein. The disclosed systems, methods, apparatus, and articles of manufacture are accordingly directed to one or more improvement(s) in the operation of a machine such as a computer or other electronic and/or mechanical device.

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

The following paragraphs provide various examples of the examples disclosed herein.

Example 1 includes a microelectronic package comprising a glass substrate including a via, the via including a high aspect ratio, and a seed layer extending substantially evenly along an inner wall of the via.

Example 2 includes the microelectronic package of example 1, wherein the high aspect ratio is greater than a six to one ratio.

Example 3 includes the microelectronic package of example 1, further including an adhesion layer extending substantially evenly along the inner wall of the via, the adhesion layer separating the seed layer from the inner wall of the via.

Example 4 includes the microelectronic package of example 1, wherein the via is a first via, and the glass substrate includes a second via different than the first via, the first via extending through the glass substrate at a first angle, the second via extending through the glass substrate at a second angle, the first angle different than the second angle.

Example 5 includes the microelectronic package of example 1, wherein the via is a first via of a plurality of vias in the glass substrate, different ones of the plurality of vias extending through the glass substrate at different angles.

Example 6 includes the microelectronic package of example 1, wherein a first portion of the via connects with a second portion of the via, the first portion and the second portion of the via extending through the glass substrate at different angles to result in a change in direction in the via.

Example 7 includes the microelectronic package of example 1, further including a first plane of metal on a first side of the glass substrate and a second plane of metal on a second side of the glass substrate, the first side opposite the second side, the first plane of metal offset relative to the second plane of metal so as to be non-overlapping in a direction perpendicular to the first plane of metal, the via angled to extend from the first plane of metal to the second plane of metal.

Example 8 includes the microelectronic package of example 1, wherein the seed layer is a metal seed layer, the metal seed layer including at least one of copper, ruthenium, cobalt, or tungsten.

Example 9 includes the microelectronic package of example 1, wherein the via is plated with a metal, the metal including copper.

Example 10 includes the microelectronic package of example 9, further including a first die mounted directly to a first side of the glass substrate and a second die mounted directly to a second side of the glass substrate, the first die and the second die connected to the via.

Example 11 includes the microelectronic package of example 1, wherein the via is filled with at least one of a dielectric plug or a magnetic plug.

Example 12 includes an apparatus comprising a glass substrate having a first side and a second side opposite the first side, the glass substrate including a first channel extending between the first and second sides at a first angle, the glass substrate including a second channel extending between the first and second surfaces at a second angle different than the first angle, and a metal seed layer positioned on a first surface of the first channel and on a second surface of the second channel, the metal seed layer on the first surface having a first thickness, the metal seed layer on the second surface having a second thickness, the first thickness the same as the second thickness.

Example 13 includes the apparatus of example 12, wherein the first channel and the second channel include high aspect ratios, and wherein the high aspect ratios are at least a ten to one ratio.

Example 14 includes the apparatus of example 12, further including an adhesion layer positioned on the first and second surfaces of the first and second channels, the adhesion layer on the first surface having a third thickness, the adhesion layer one the second surface having a fourth thickness, the third thickness the same as the fourth thickness, the adhesion layer deposited between the metal seed layer and the first and second channels.

Example 15 includes the apparatus of example 12, wherein the first and second channels are different ones of a plurality of channels arranged in an array in the glass substrate, successive ones of the plurality of channels including a plurality of first ends and a plurality of second ends, a first pitch of the plurality of first ends is less than a second pitch of the plurality of second ends.

Example 16 includes the apparatus of example 12, wherein the first channel intersects with the second channel at a location spaced apart from and between the first and second sides of the glass substrate.

Example 17 includes the apparatus of example 12, wherein the glass substrate includes hairpin filters, a first one of the hairpin filters is connected to the first channel, the first channel including a first portion extending through the glass substrate substantially parallel to the first side of the glass substrate, and a second portion extending through the glass substrate at a non-perpendicular and non-parallel angle to the first side of the glass substrate.

Example 18 includes the apparatus of example 17, the first channel further including a third portion extending through the glass substrate substantially parallel to the first portion, the first portion connected to a first side of the second portion and the third portion connected to a second side of the second portion.

Example 19 includes a microelectronic package comprising a glass substrate including a via, a first layer on an wall of the via, the first layer including at least one of titanium, tungsten, or nitrogen, and a second layer on the first layer, the second layer including at least one of copper, ruthenium, cobalt, or tungsten.

Example 20 includes the microelectronic package of example 19, wherein the second layer includes ruthenium.

Example 21 includes the microelectronic package of example 19, wherein the via has an aspect ratio of greater than six to one.

Example 22 includes the microelectronic package of example 19, wherein the via is a first via, and the glass substrate includes a second via different than the first via, the first via extending through the glass substrate at a first angle, the second via extending through the glass substrate at a second angle, the first angle different than the second angle.

Example 23 includes the microelectronic package of example 19, wherein the via is a first via of a plurality of vias in the glass substrate, different ones of the plurality of vias extending through the glass substrate at different angles.

Example 24 includes the microelectronic package of example 19, further including a first plane of metal on a first side of the glass substrate and a second plane of metal on a second side of the glass substrate, the first side opposite the second side, the first plane of metal offset relative to the second plane of metal so as to be non-overlapping in a direction perpendicular to the first plane of metal, the via angled to extend from the first plane of metal to the second plane of metal.

Example 25 includes the microelectronic package of example 19, further including a first die mounted directly to a first side of the glass substrate and a second die mounted directly to a second side of the glass substrate, the first die and the second die connected to the via.

Example 26 includes the microelectronic package of example 19, wherein the via is filled with at least one of a dielectric material or a magnetic material.

Example 27 includes a method to manufacture a microelectronic package, the method comprising generating a via in a glass substrate, the via including a high aspect ratio, and depositing a seed layer in the via using atomic layer deposition (ALD), the seed layer deposited substantially evenly along an inner wall of the via.

Example 28 includes the method of example 27, wherein the high aspect ratio is at least a six to one ratio.

Example 29 includes the method of example 27, further including depositing an adhesion layer substantially evenly along the inner wall of the via, the adhesion layer deposited between the seed layer and the inner wall of the via.

Example 30 includes the method of example 27, wherein the via is a first via, further including generating a second via different than the first via, the first via extending through the glass substrate at a first angle, the second via extending through the glass substrate at a second angle, the first angle different than the second angle.

Example 31 includes the method of example 30, wherein depositing the seed layer includes depositing the seed layer in both the first via and the second via concurrently.

Example 32 includes the method of example 27, further including connecting a first metal plane on a first side of the glass substrate and a second metal plane on a second side of the glass substrate, wherein the via is angled between the first metal plane and second metal plane.

Example 33 includes the method of example 27, wherein generating the via in the glass substrate includes generating a first portion of the via, and generating a second portion of the via, the first portion of the via and the second portion of the via connected at angles relative to one another such that there is no straight line of sight through the via.

The following claims are hereby incorporated into this Detailed Description by this reference, with each claim standing on its own as a separate embodiment of the present disclosure.

What is claimed is:

1. A microelectronic package comprising:
a glass substrate including a via, the via including an aspect ratio greater than a six to one ratio, a first portion of the via connects with a second portion of the via, the first portion and the second portion extending through the glass substrate at different first and second angles such that there is a change in direction along a length of the via, the first portion having a first width and the second portion having a second width, the second width different from the first width; and
a seed layer extending substantially evenly along an inner wall of the via.

2. The microelectronic package of claim 1, including an adhesion layer extending substantially evenly along the inner wall of the via, the adhesion layer separating the seed layer from the inner wall of the via.

3. The microelectronic package of claim 1, wherein the via is a first via, and the glass substrate includes a second via different than the first via, the second via extending through the glass substrate at a third angle, the third angle different than the first angle and different than the second angle.

4. The microelectronic package of claim 1, wherein the via is a first via of a plurality of vias in the glass substrate, different ones of the plurality of vias extending through the glass substrate at different angles.

5. The microelectronic package of claim 1, including a first plane of metal on a first side of the glass substrate and a second plane of metal on a second side of the glass substrate, the first side opposite the second side, the first plane of metal offset relative to the second plane of metal so as to be non-overlapping in a direction perpendicular to the first plane of metal, the via to extend from the first plane of metal to the second plane of metal.

6. The microelectronic package of claim 1, wherein the seed layer is a metal seed layer, the metal seed layer including at least one of copper, ruthenium, cobalt, or tungsten.

7. The microelectronic package of claim 1, wherein the via is plated with a metal, the metal including copper.

8. The microelectronic package of claim 7, including a first die mounted directly to a first side of the glass substrate and a second die mounted directly to a second side of the glass substrate, the first die and the second die connected to the via.

9. The microelectronic package of claim 1, wherein the via is filled with at least one of a dielectric plug or a magnetic plug.

10. An apparatus comprising:
a glass substrate having a first side and a second side opposite the first side, the glass substrate including a first channel extending between the first and second sides at a first angle, the glass substrate including a second channel extending between the first and second sides at a second angle different than the first angle, the glass substrate including hairpin filters, a first one of the hairpin filters is connected to the first channel, the first channel including:

a first portion extending through the glass substrate substantially parallel to the first side of the glass substrate, and
a second portion extending through the glass substrate at a non-perpendicular and non-parallel angle to the first side of the glass substrate; and
a metal seed layer on a first surface of the first channel and on a second surface of the second channel, the metal seed layer on the first surface having a first thickness, the metal seed layer on the second surface having a second thickness, the first thickness the same as the second thickness.

11. The apparatus of claim 10, wherein the first channel and the second channel include aspect ratios of at least a ten to one ratio.

12. The apparatus of claim 10, including an adhesion layer on the first and second surfaces of the first and second channels, the adhesion layer on the first surface having a third thickness, the adhesion layer on the second surface having a fourth thickness, the third thickness the same as the fourth thickness, the adhesion layer between the metal seed layer and the first and second channels.

13. The apparatus of claim 10, wherein the first and second channels are different ones of a plurality of channels in an array in the glass substrate, successive ones of the plurality of channels including a plurality of first ends and a plurality of second ends, a first pitch of the plurality of first ends is less than a second pitch of the plurality of second ends.

14. The apparatus of claim 10, wherein the first channel intersects with the second channel at a location spaced apart from and between the first and second sides of the glass substrate.

15. The apparatus of claim 10, the first channel including a third portion extending through the glass substrate substantially parallel to the first portion, the first portion connected to a first side of the second portion and the third portion connected to a second side of the second portion.

16. A microelectronic package comprising:
a glass substrate having a first surface and a second surface opposite the first surface, the glass substrate including a via and a hairpin filter connected to the via, a first portion of the via extending through the glass substrate substantially parallel to the first surface of the glass substrate, a second portion of the via extending through the glass substrate at a non-perpendicular and non-parallel angle to the first surface of the glass substrate;
a first layer on a wall of the via, the first layer including at least one of titanium, tungsten, or nitrogen; and
a second layer on the first layer, the second layer including ruthenium.

17. The microelectronic package of claim 16, wherein the via has an aspect ratio of greater than six to one.

18. The microelectronic package of claim 16, wherein the via is a first via, and the glass substrate includes a second via different than the first via, the first via extending through the glass substrate at a first angle, the second via extending through the glass substrate at a second angle, the first angle different than the second angle.

19. The microelectronic package of claim 16, wherein the via is a first via of a plurality of vias in the glass substrate, different ones of the plurality of vias extending through the glass substrate at different angles.

20. The microelectronic package of claim 16, wherein the via is a first via and the microelectronic package includes:
a first plane of metal on a first side of the glass substrate;

a second plane of metal on a second side of the glass substrate, the first side opposite the second side, the first plane of metal offset relative to the second plane of metal so as to be non-overlapping in a direction perpendicular to the first plane of metal; and a second via to extend from the first plane of metal to the second plane of metal at a non-perpendicular angle relative to the first and second planes.

21. The microelectronic package of claim 16, wherein the via is filled with at least one of a dielectric material or a magnetic material.

22. A microelectronic package comprising:

a glass substrate including:

a via having an aspect ratio greater than a six to one ratio, a first portion of the via connects with a second portion of the via, the first portion and the second portion extending through the glass substrate at different angles to result in a first change in direction along a length of the via, and a first surface and a second surface opposite the first surface, a third portion of the via connects with the second portion of the via, the second and third portions of the via extending through the glass substrate at different angles to result in a second change in direction in the via, the first portion extending from the second portion to at least one of the first surface or the second surface, the third portion extending from the second portion to at least one of the first surface or the second surface, the second portion spaced apart from the first surface and spaced apart from the second surface; and a seed layer extending substantially evenly along an inner wall of the via.

* * * * *